(12) United States Patent
Mori

(10) Patent No.: US 11,467,492 B2
(45) Date of Patent: Oct. 11, 2022

(54) COMPOSITION, FILM, INFRARED TRANSMITTING FILTER, SOLID IMAGE PICKUP ELEMENT, IMAGE DISPLAY DEVICE, AND INFRARED SENSOR

(71) Applicant: FUJIFILM Corporation, Tokyo (JP)

(72) Inventor: Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 471 days.

(21) Appl. No.: 16/724,953

(22) Filed: Dec. 23, 2019

(65) Prior Publication Data

US 2020/0124962 A1 Apr. 23, 2020

Related U.S. Application Data

(63) Continuation of application No. PCT/JP2018/025616, filed on Jul. 6, 2018.

(30) Foreign Application Priority Data

Jul. 13, 2017 (JP) .............................. JP2017-136689
Jan. 15, 2018 (JP) .............................. JP2018-004292

(51) Int. Cl.
*G03F 7/031* (2006.01)
*G03F 7/00* (2006.01)
(Continued)

(52) U.S. Cl.
CPC ............ *G03F 7/031* (2013.01); *G03F 7/0007* (2013.01); *G03F 7/027* (2013.01); *G02B 5/208* (2013.01);
(Continued)

(58) Field of Classification Search
CPC ........ G03F 7/031; G03F 7/0007; G03F 7/027; G03F 7/0388; G03F 7/004; G03F 7/028; G02B 5/208
See application file for complete search history.

(56) References Cited

U.S. PATENT DOCUMENTS

2015/0260885 A1* 9/2015 Takishita .............. G03F 7/0007
252/586
2017/0010530 A1 1/2017 Idei et al.
(Continued)

FOREIGN PATENT DOCUMENTS

CN 103890660 A 6/2014
CN 105446079 A 3/2016
(Continued)

OTHER PUBLICATIONS

Japanese Office Action for corresponding Japanese Application No. 2019-529102, dated Jan. 26, 2021, with English translation.
(Continued)

*Primary Examiner* — Stewart A Fraser
(74) *Attorney, Agent, or Firm* — Birch, Stewart, Kolasch & Birch, LLP

(57) ABSTRACT

Provided is a composition with which a pattern having excellent adhesiveness can be formed. In addition, provided are a film, an infrared transmitting filter, a solid image pickup element, an image display device, and an infrared sensor. This composition includes a coloring material, a resin, a polymerizable compound, and a photopolymerization initiator. The polymerizable compound includes a compound A having an alkyleneoxy group and three ethylenically unsaturated groups, and a ratio A/B of a minimum value A of an absorbance of the composition in a wavelength range of 400 to 750 nm to a maximum value B of an absorbance of the composition in a wavelength range of 1100 to 1300 nm is 4.5 or higher.

17 Claims, 1 Drawing Sheet

(51) Int. Cl.
  *G03F 7/027* (2006.01)
  *G02B 5/20* (2006.01)
  *H01L 27/146* (2006.01)
  *H01L 27/32* (2006.01)

(52) U.S. Cl.
  CPC .. *H01L 27/14621* (2013.01); *H01L 27/14623* (2013.01); *H01L 27/14627* (2013.01); *H01L 27/14645* (2013.01); *H01L 27/14649* (2013.01); *H01L 27/3272* (2013.01)

(56) References Cited

U.S. PATENT DOCUMENTS

| | | |
|---|---|---|
| 2017/0102610 A1 | 4/2017 | Chiu et al. |
| 2018/0118865 A1 | 5/2018 | Arayama et al. |
| 2019/0243039 A1 | 8/2019 | Takishita et al. |

FOREIGN PATENT DOCUMENTS

| | | |
|---|---|---|
| CN | 106164182 A | 11/2016 |
| JP | 2008-134281 A | 6/2008 |
| JP | 2014-130338 A | 7/2014 |
| JP | 2016-177079 A | 10/2016 |
| TW | 201700631 A | 1/2017 |
| WO | WO 2015/151988 A1 | 10/2015 |
| WO | WO 2016/194527 A1 | 12/2016 |
| WO | WO 2017/038252 A1 | 3/2017 |
| WO | WO 2017/086288 A1 | 5/2017 |
| WO | WO 2018/092600 A1 | 5/2018 |

OTHER PUBLICATIONS

International Preliminary Report on Patentability and Written Opinion of the International Searching Authority (Forms PCT/IB/326, PCT/IB/373, and PCT/ISA/237), for International Application No. PCT/JP2018/025616, dated Jan. 23, 2020, with English translation of the Written Opinion.
International Search Report (Form PCT/ISA/210) for International Application No. PCT/JP2018/025616, dated Oct. 9, 2018, with English translation.
Taiwanese Office Action issued in corresponding Taiwanese Application No. 107123757 dated Nov. 10, 2021, with an English translation.
Korean Office Action for corresponding Korean Application No. 10-2019-7038158, dated Aug. 24, 2021, with English translation.
Chinese Office Action and Search Report for corresponding Chinese Application No. 201880044215.X, dated Jun. 3, 2021, with an English translation.

* cited by examiner

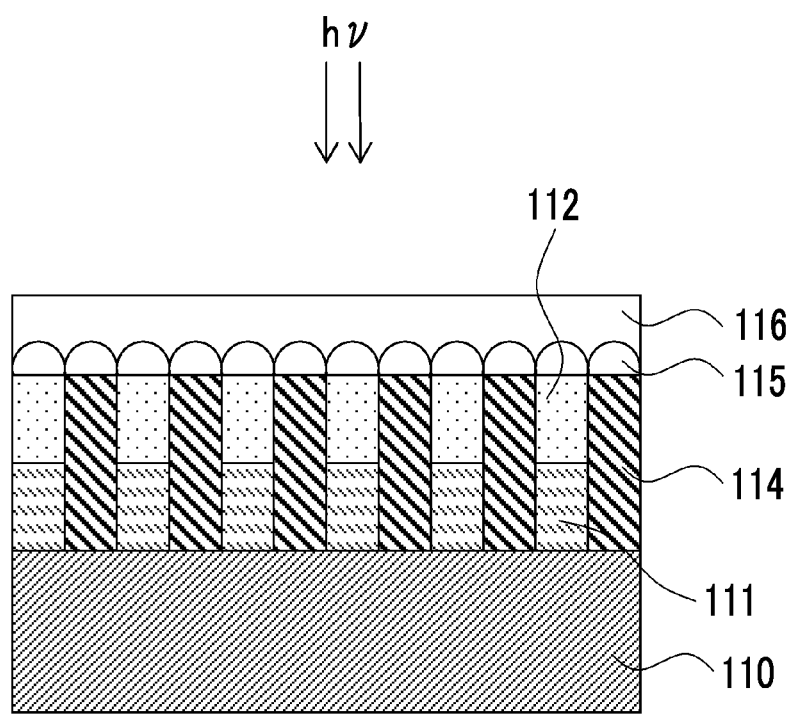

COMPOSITION, FILM, INFRARED TRANSMITTING FILTER, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2018/025616 filed on Jul. 6, 2018, which claims priority under 35 U.S.C § 119(a) to Japanese Patent Application No. 2017-136689 filed on Jul. 13, 2017 and Japanese Patent Application No. 2018-004292 filed on Jan. 15, 2018. Each of the above application(s) is hereby expressly incorporated by reference, in its entirety, into the present application.

BACKGROUND OF THE INVENTION

1. Field of the Invention

The present invention relates to a composition, a film, an infrared transmitting filter, a solid image pickup element, an image display device, and an infrared sensor.

2. Description of the Related Art

A solid image pickup element is used as an optical sensor in various applications. For example, infrared light is less likely to be scattered than visible light due to its longer wavelength and can be used in, for example, distance measurement or three-dimensional measurement. In addition, infrared light is invisible to humans or animals. Therefore, even in a case where a subject is irradiated with infrared light using an infrared light source at night, the object cannot recognize the infrared light. Thus, infrared light can be used for imaging a nocturnal wild animal or imaging a subject without provoking the object for security reasons. This way, an optical sensor (infrared sensor) that detects infrared light can be used in various applications, and the development of an infrared transmitting filter has been desired recently.

As spectral characteristics required for an infrared transmitting filter, spectral characteristics in which the light shielding properties of visible light are high and transmission of infrared light in a specific wavelength range can be selectively allowed are desired. A composition for forming a film having the above-described spectral characteristics has been investigated.

JP2014-130338A describes a composition in which, in a case where a film having a thickness of 1 μm is formed using the composition, a maximum value of a light transmittance of the film in a thickness direction in a wavelength range of 400 to 750 nm is 20% or lower, and a minimum value of a light transmittance of the film in the thickness direction in a wavelength range of 900 to 1300 nm is 90% or higher.

JP2016-177079A describes a curable composition including a colorant, a binder resin, and a polymerizable compound, in which in a case where a cured film having a thickness of 1.2 μm is formed, the following conditions (1) to (3) are satisfied.

Condition (1): a maximum light transmittance at a wavelength of 400 to 600 nm is 5% or lower.

Condition (2): a light transmittance at a wavelength of 700 nm is 10% or lower.

Condition (3): a minimum light transmittance at a wavelength of 850 to 1000 nm is 80% or higher.

SUMMARY OF THE INVENTION

A composition used for manufacturing an infrared transmitting filter tends to have low transmittance with respect to light used for exposure. Therefore, adhesiveness with a support tends to be insufficient. Therefore, in the related art, a method of improving the sensitivity of the composition using a polymerizable compound having four or more functional groups and sufficiently curing the film up to the lower portion has been disclosed. In Examples of JP2014-130338A and JP2016-177079A, a compound having four or more ethylenically unsaturated groups is used as the polymerizable compound.

On the other hand, recently, it has been required to reduce a pixel size in an infrared transmitting filter.

Accordingly, an object of the present invention is to provide a composition in which a pattern having excellent adhesiveness can be formed even in a case where a fine pattern is formed. In addition, another object of the present invention is to provide a film, an infrared transmitting filter, a solid image pickup element, an image display device, and an infrared sensor.

As a result of thorough investigation under the above-described circumstances, the present inventors found that the objects of the present invention can be achieved with a composition having a configuration described below, thereby completing the present invention. Accordingly, the present invention provides the following.

<1> A composition comprising:
a coloring material;
a resin;
a polymerizable compound; and
a photopolymerization initiator,
in which the polymerizable compound includes a compound A having an alkyleneoxy group and three ethylenically unsaturated groups, and
a ratio A/B of a minimum value A of an absorbance of the composition in a wavelength range of 400 to 750 nm to a maximum value B of an absorbance of the composition in a wavelength range of 1100 to 1300 nm is 4.5 or higher.

<2> The composition according to <1>,
in which the compound A has 2 to 6 alkyleneoxy groups.

<3> The composition according to <1> or <2>,
in which the number of carbon atoms in the alkyleneoxy group is 1 to 3.

<4> The composition according to any one of <1> to <3>,
in which an average number of alkyleneoxy groups in the compound A is 3 to 5.

<5> The composition according to any one of <1> to <4>,
in which the compound A includes a compound having three alkyleneoxy groups and a compound having 4 to 6 alkyleneoxy groups.

<6> The composition according to <5>,
in which in the compound A, a content of the compound having 4 to 6 alkyleneoxy groups is 20 to 500 parts by mass with respect to 100 parts by mass of the compound having three alkyleneoxy groups.

<7> The composition according to any one of <1> to <6>,
in which the polymerizable compound further includes a compound having four or more ethylenically unsaturated groups.

<8> The composition according to any one of <1> to <7>, wherein a content of the compound A is 50 to 100 mass % with respect to a total mass of the polymerizable compound.

<9> The composition according to any one of <1> to <8>, in which a molar absorption coefficient of the photopolymerization initiator at a wavelength of 365 nm is 5000 L·mol$^{-1}$·cm$^{-1}$ or higher.

<10> The composition according to any one of <1> to <9>, in which the photopolymerization initiator includes an oxime compound.

<11> The composition according to any one of <1> to <10>, in which the resin includes a resin having a fluorene skeleton.

<12> The composition according to any one of <1> to <11>, further comprising:
a near infrared absorber.

<13> A film which is formed using the composition according to any one of <1> to <12>.

<14> An infrared transmitting filter comprising:
the film according to <13>.

<15> A solid image pickup element comprising:
the film according to <13>.

<16> An image display device comprising:
the film according to <13>. <17> An infrared sensor comprising:
the film according to <13>.

According to the present invention, a composition with which a pattern having excellent adhesiveness can be formed can be provided. In addition, a film, an infrared transmitting filter, a solid image pickup element, an image display device, and an infrared sensor can be provided.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other, and using tetrahydrofuran as a developing solvent.

In this specification, in a chemical formula, Me represents a methyl group, Et represents an ethyl group, Bu represents a butyl group, and Ph represents a phenyl group.

In this specification, near infrared light denotes light (electromagnetic wave) having a wavelength in a range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Composition>

A composition according to an embodiment of the present invention comprises:
a coloring material;
a resin;
a polymerizable compound; and
a photopolymerization initiator,
in which the polymerizable compound includes a compound A having an alkyleneoxy group and three ethylenically unsaturated groups, and
a ratio A/B of a minimum value A of an absorbance of the composition in a wavelength range of 400 to 750 nm to a maximum value B of an absorbance of the composition in a wavelength range of 1100 to 1300 nm is 4.5 or higher.

In the composition according to the embodiment of the present invention, the ratio A/B of the minimum value A of the absorbance of the composition in a wavelength range of 400 to 750 nm to the maximum value B of the absorbance of the composition in a wavelength range of 1100 to 1300 nm is 4.5 or higher. Therefore, a film that shields visible light and allows transmission of infrared light in a specific wavelength range can be formed.

In addition, the composition according to the embodiment of the present invention is a composition having the above-described spectral characteristics. In this composition having the spectral characteristics, transmittance with respect to light used for exposure tends to be low, and it is difficult to form a fine pattern with excellent adhesiveness. However, the composition according to the present invention includes the above-described compound A such that a fine pattern can be formed with excellent adhesiveness. The reason why this effect is obtained is presumed to be as follows. This compound A has three ethylenically unsaturated groups. Therefore, it is presumed that a polymerization reaction of the compound A appropriately progresses due to an initiating species such as a radical generated from a photopolymerization initiator during exposure, and the film can be sufficiently cured up to the lower portion while suppressing line thickening of the film surface. That is, the initiating species such as a radical generated from a photopolymerization initiator during exposure may be diffused in the film. In the polymerizable compound, reactivity tends to increase as the number of ethylenically unsaturated groups increases, and even in a case where the amount of the initiating species diffused in the film is small, the polymerization reaction may sufficiently progress. Therefore, for example, even in a mask peripheral portion, an unnecessary polymerization reaction progresses due to the initiating species diffused in the film, and the line width is likely to be thicker than the design dimension of the mask. However, since this compound A includes the compound having three ethylenically unsaturated groups, the reactivity is mild. As a result, it is presumed that the film can be sufficiently cured up to the lower portion while suppressing an unnecessary polymerization reaction in the mask peripheral portion. This compound A further has an alkyleneoxy group. Therefore, it is presumed that the developability of the film can be improved. Therefore, even in a case where a region where a mild reaction occurs more than a desired line width due to the diffusion of the initiating species is formed, this region can be removed by development, and thus it is presumed that a fine pattern can be formed with excellent adhesiveness.

In addition, the composition according to the embodiment of the present invention includes the above-described compound A such that a pattern having a low refractive index can be formed. Therefore, even in a case where a pixel (for example, a colored pixel) of a color filter is formed adjacent to the pattern (pixel) formed using the composition according to the embodiment of the present invention, light is not likely to leak and be incident from the adjacent pixel into the pixel formed using the composition according to the embodiment of the present invention, and noise generated by visible light can also be reduced.

In the composition according to the embodiment of the present invention, the absorbance conditions can be suitably achieved by adjusting, for example, the kind and content of the light shielding material.

Regarding the spectral characteristics of the composition according to the embodiment of the present invention, the value of A/B is preferably 7.5 or higher, more preferably 15 or higher, and still more preferably 30 or higher.

An absorbance $A\lambda$ at a wavelength $\lambda$ is defined by the following Expression (1).

$$A\lambda = -\log(T\lambda/100) \quad (1)$$

$A\lambda$ represents the absorbance at the wavelength $\lambda$, and $T\lambda$ represents a transmittance (%) at the wavelength $\lambda$.

In the present invention, a value of the absorbance may be a value measured in the form of a solution or a value of a film which is formed using the composition. In a case where the absorbance is measured in the form of the film, it is preferable that the absorbance is measured using a film that is formed by applying the composition to a glass substrate using a method such as spin coating such that the thickness of the dried film is a predetermined value, and drying the applied composition using a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be obtained by measuring using a well-known spectrophotometer of the related art. Measurement conditions of the absorbance are not particularly limited. It is preferable that the maximum value B of the absorbance in a wavelength range of 1100 to 1300 nm is measured under conditions which are adjusted such that the minimum value A of the absorbance in a wavelength range of 400 to 750 nm is 0.1 to 3.0. By measuring the absorbance under the conditions, the measurement error can be further reduced. A method of adjusting the minimum value A of the absorbance in a wavelength range of 400 to 750 nm to be 0.1 to 3.0 is not particularly limited. For example, in a case where the absorbance is measured in the form of the composition, for example, a method of adjusting the optical path length of a sample cell can be used. In addition, in a case where the absorbance is measured in the form of the film, for example, a method of adjusting the thickness of the film can be used.

A specific example of a method of measuring the spectral characteristics and the thickness of the film formed using the composition according to the embodiment of the present invention is as follows.

The composition according to the embodiment of the present invention is applied to a glass substrate using a method such as spin coating such that the thickness of the dried film is a predetermined value, and then is dried using a hot plate at 100° C. for 120 seconds. The thickness of the film is obtained by measuring the thickness of the dried substrate including the film using a stylus surface profilometer (DEKTAK 150, manufactured by ULVAC Inc.). The transmittance of the dried substrate including the film is measured in a wavelength range of 300 to 1300 nm using an ultraviolet-visible-near infrared spectrophotometer (U-4100, manufactured by Hitachi High-Technologies Corporation).

The composition according to the embodiment of the present invention can also be referred to as an infrared light transmitting composition because it allows transmission of infrared light. Hereinafter, each of components which can form the composition according to the embodiment of the present invention will be described.

<<Coloring Material>>

The composition according to the embodiment of the present invention includes the coloring material. In the present invention, it is preferable that the coloring material is a material that allows at least a part of light in a near infrared range and shields light in a visible range. In the present invention, it is preferable that the coloring material is a material that absorbs light in a wavelength range of violet to red. In addition, in the present invention, it is preferable that the coloring material is a coloring material that shields light in a wavelength range of 400 to 750 nm. In addition, it is preferable that the coloring material is a material that allows transmission of light in a wavelength range of 1100 to 1300 nm. In the present invention, it is preferable that the coloring material satisfies at least one of the following requirement (A) or (B).

(1): The coloring material includes two or more chromatic colorants, and a combination of the two or more chromatic colorants forms black.

(2) The coloring material includes an organic black colorant. In the aspect (2), it is preferable that the coloring material further includes a chromatic colorant.

In the present invention, the chromatic colorant denotes a colorant other than a white colorant and a black colorant. In addition, in the present invention, the organic black colorant denotes a material that absorbs visible light and allows transmission of at least a part of infrared light. Accordingly, in the present invention, the organic black colorant does not denote a black colorant that absorbs both visible light and infrared light, for example, carbon black or titanium black. It is preferable that the organic black colorant is a colorant having a maximum absorption wavelength in a wavelength range of 400 nm to 700 nm.

It is preferable that the coloring material is a material in which a ratio A/B of a minimum value A of an absorbance in a wavelength range of 400 to 750 nm to a minimum value B of an absorbance in a wavelength range of 1100 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

In the present invention, it is preferable that the chromatic colorant is selected from the group consisting of a red colorant, a green colorant, a blue colorant, a yellow colorant, a violet colorant, and an orange colorant. In the present invention, the chromatic colorant may be a pigment or a dye. It is preferable that the chromatic colorant is a pigment. An average particle size (r) of the pigment satisfies preferably 20 nm≤r=300 nm, more preferably 25 nm≤r≤250 nm, and still more preferably 30 nm≤r≤200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, secondary particles having a particle size of (average particle size±100) nm account for preferably 70 mass % or higher and more preferably 80 mass % or higher in the pigment. The particle size distribution of the secondary particles can be measured using a scattering intensity distribution.

As the pigment, an organic pigment is preferable. Preferable examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

In addition, as the pigment, a metal azo pigment including at least one anion selected from an azo compound represented by the following Formula (I) or an azo compound having a tautomeric structure of the azo compound represented by Formula (I), two or more metal ions, and a melamine compound can be used.

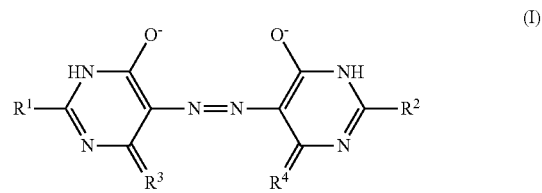

(I)

In the formula, $R^1$ and $R^2$ each independently represent OH or $NR^5R^6$, $R^3$ and $R^4$ each independently represent =O or =$NR^7$, and $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include a substituent T described below. In particular, a halogen atom, a hydroxy group, an alkoxy group, a cyano group, or an amino group is preferable.

In Formula (I), it is preferable that $R^1$ and $R^2$ represent OH. In addition, it is preferable that $R^3$ and $R^4$ represent O.

It is preferable that the melamine compound in the metal azo pigment is a compound represented by the following Formula (II).

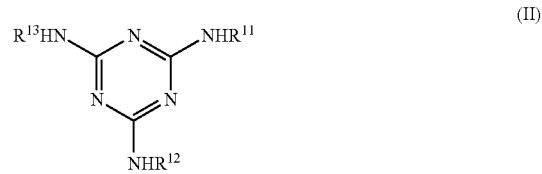

(II)

In the formula, $R^{11}$ to $R^{13}$ each independently represent a hydrogen atom or an alkyl group. The number of carbon atoms in the alkyl group is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include the substituent T described below. In particular, a hydroxy group is preferable. It is preferable that at least one of $R^{11}$, . . . , or $R^{13}$ represents a hydrogen atom, and it is more preferable that all of $R^{11}$ to $R^{13}$ represent a hydrogen atom.

In the metal azo pigment, the content of the melamine compound (preferably the compound represented by Formula (II)) is preferably 0.05 to 4 mol, more preferably 0.5 to 2.5 mol, and still more preferably 1.0 to 2.0 mol with respect to 1 mol of at least one anion selected from an azo compound represented by Formula (I) or an azo compound having a tautomeric structure of the azo compound represented by Formula (I).

In the metal azo pigment, it is preferable that at least one anion selected from an azo compound represented by Formula (I) or an azo compound having a tautomeric structure of the azo compound represented by Formula (I) and a metal ion form a metal complex. For example, in the case of a divalent metal ion Me, the anion and the metal ion Me form a metal complex having a structure represented by the following Formula (Ia). In addition, the metal ion Me may be bonded through a nitrogen atom in the tautomeric representation of Formula (Ia).

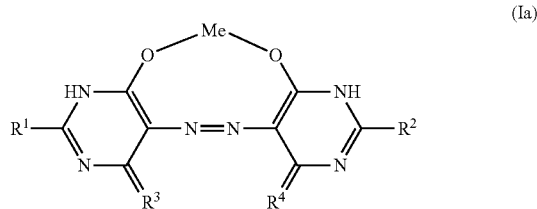

Examples of a preferable aspect of the metal azo pigment used in the present invention include metal azo pigments according to the following aspects (1) to (4). In particular, a metal azo pigment according to the aspect (1) is preferable.

(1) A metal azo pigment according to an aspect including at least one anion selected from an azo compound represented by Formula (I) or an azo compound having a tautomeric structure of the azo compound represented by Formula (I), metal ions including at least $Zn^{2+}$ and $Cu^{2+}$, and a melamine compound. In this aspect, the total content of $Zn^{2+}$ and $Cu^{2+}$ is preferably 95 to 100 mol %, more preferably 98 to 100 mol %, still more preferably 99.9 to 100 mol %, and still more preferably 100 mol % with respect to 1 mol of all the metal ions of the metal azo pigment. In addition, a molar ratio $Zn^{2+}:Cu^{2+}$ of $Zn^{2+}$ to $Cu^{2+}$ in the metal azo pigment is preferably 199:1 to 1:15, more preferably 19:1 to 1:1, and still more preferably 9:1 to 2:1. In addition, in this aspect, the metal azo pigment may further include a divalent or trivalent metal ion (hereinafter, also referred to as "metal ion Me1") in addition to $Zn^{2+}$ and $Cu^{2+}$. Examples of the metal ion Me1 include $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, and $Ba^{2+}$. Among these, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable, and at least one selected from $Al^{3+}$, $Fe^{2+}$, $Fe^{3+}$, $Co^{2+}$, or $Co^{3+}$ is still more preferable. The content of the metal ion Me1 is preferably 5 mol % or lower, more preferably 2 mol % or lower, and still more preferably 0.1 mol % or lower with respect to 1 mol of all the metal ions of the metal azo pigment.

(2) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Zn^{2+}$, and at least one metal ion Me2, and the metal ion Me2 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$, or $Pb^{2+}$. As the metal ion Me2, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mg^{2+}$, $Ca^{2+}$, $Sr^{2+}$, $Y^{3+}$, or $Mn^{2+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Zn^{2+}$ and $Ni^{2+}$ is 75 to 99.5 mol % and the content of the metal ion Me2 is 0.5 to 25 mol % with respect to 1 mol of all the metal ions of the metal azo pigment, it is more preferable that the total content of $Zn^{2+}$ and $Ni^{2+}$ is 78 to 95 mol % and the content of the metal ion Me2 is 5 to 22 mol % with respect to 1 mol of all the metal ions of the metal azo pigment, and it is still preferable that the total content of $Zn^{2+}$ and $Ni^{2+}$ is 82 to 90 mol % and the content of the metal ion Me2 is 10 to 18 mol % with respect to 1 mol of all the metal ions of the metal azo pigment. In addition, a molar ratio $Zn^{2+}:Ni^{2+}$ of $Zn^{2+}$ to $Ni^{2+}$ in the metal azo pigment is preferably 90:3 to 3:90, more preferably 80:5 to 5:80, and still more preferably 60:33 to 33:60.

(3) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Cu^{2+}$, and at least one metal ion Me3, and the metal ion Me3 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, or $Ba^{2+}$. As the metal ion Me3, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Cu^{2+}$ and $Ni^{2+}$ is 70 to 99.5 mol % and the content of the metal ion Me3 is 0.5 to 30 mol % with respect to 1 mol of all the metal ions of the metal azo pigment, it is more preferable that the total content of $Cu^{2+}$ and $Ni^{2+}$ is 75 to 95 mol % and the content of the metal ion Me3 is 5 to 25 mol % with respect to 1 mol of all the metal ions of the metal azo pigment, and it is still more preferable that the total content of $Cu^{2+}$ and $Ni^{2+}$ is 80 to 90 mol % and the content of the metal ion Me3 is 10 to 20 mol % with respect to 1 mol of all the metal ions of the metal azo pigment. In addition, a molar ratio $Cu^{2+}:Ni^{2+}$ of $Cu^{2+}$ to $Ni^{2+}$ in the metal azo pigment is preferably 42:1 to 1:42, more preferably 10:1 to 1:10, and still more preferably 3:1 to 1:3.

(4) A metal azo pigment according to an aspect including at least one anion selected from an azo compound represented by Formula (I) or an azo compound having a tautomeric structure of the azo compound represented by Formula (I), metal ions, and a melamine compound, in which the metal ions include $Ni^{2+}$ and a metal ion Me4a, and the metal ion Me4a is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, or $Yb^{3+}$. As the metal ion Me4a, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, or $Yb^{3+}$ is preferable, and at least one selected from $La^{3+}$, $Ce^{3+}$, $Pr^{3+}$, $Nd^{3+}$, $Sm^{3+}$, $Tb^{3+}$, or $Ho^{3+}$ is more preferable. In this aspect, the total content of $Ni^{2+}$ and the metal ion Me4a is preferably 95 to 100 mol %, more preferably 98 to 100 mol %, still more preferably 99.9 to 100 mol %, and still more preferably 100 mol % with respect to 1 mol of all the metal ions of the metal azo pigment. In addition, a molar ratio $Ni^{2+}$:Metal ion Me4a of $Ni^{2+}$ to the metal ion Me4a in the metal azo pigment is preferably 1:1 to 19:1, more preferably 2:1 to 4:1, and still more preferably 2.3:1 to 3:1. In addition, in this aspect, the metal azo pigment may further include a metal ion (hereinafter, also referred to as "metal ion Me4b") in addition to $Ni^{2+}$ and the metal ion Me4a. Examples of the metal ion Me4b include $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Fe^{2+}$, $Fe^{3+}$, $Co^{2+}$, $Co^{3+}$, $Cu^{2+}$, $Zn^{2+}$, $Cd^{2+}$, $Al^{3+}$, and $Pb^{2+}$. Among these, at least one selected from $Mg^{2+}$, $Ca^{2+}$, $Sr^{2+}$, $Y^{3+}$, $Mn^{2+}$, $Fe^{2+}$, $Fe^{3+}$, $Co^{2+}$, $Co^{3+}$, $Cu^{2+}$, $Zn^{2+}$, or $Al^{3+}$ is preferable, and at least one selected from $Sr^{2+}$, $Fe^{2+}$, $Fe^{3+}$, $Co^{2+}$, $Co^{3+}$, $Cu^{2+}$, $Zn^{2+}$, or $Al^{3+}$ is more preferable. In addition, the content of the metal ion Me4b is preferably 5 mol % or lower, more preferably 2 mol % or lower, and still more preferably 0.1 mol % or lower with respect to 1 mol of all the metal ions of the metal azo pigment.

In the metal azo pigment, it is preferable that a metal azo compound composed of at least one anion selected from an azo compound represented by Formula (I) or an azo compound having a tautomeric structure of the azo compound represented by Formula (I) and metal ions and a melamine compound (preferably the compound represented by Formula (II)) form an adduct. It can be understood that the adduct is a molecular aggregate. For example, an intermolecular bond may be formed by an intermolecular interaction, by a Lewis acid-base interaction, or by a coordinate bond or a chain conjugation. In addition, the adduct may have a structure such as a clathrate compound in which a guest molecule is incorporated into a lattice of host molecules. In addition, the adduct may have a structure such as mixed intercalation crystals (including an interstitial compound). The mixed intercalation crystals refer to chemical non-stoichiometric crystalline compounds composed of at least two elements. In addition, the adduct may be mixed substitution crystals in which two materials form a common crystal and atoms of a second component are positioned at positions of a regular lattice of a first component.

The metal azo pigment may be a physical mixture or a chemical mixed compound. It is preferable that the metal azo pigment is a physical mixture.

The details of the metal azo pigment can be found in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

It is preferable that the coloring material includes two or more selected from a red colorant, a blue colorant, a yellow colorant, a violet colorant, and a green colorant. Examples of a preferable combination are as follows. Among these, (2), (3), or (4) is preferable, and (3) is more preferable.

(1) An aspect in which the coloring material includes a red colorant and a blue colorant (2) An aspect in which the coloring material includes a red colorant, a blue colorant, and a yellow colorant (3) An aspect in which the coloring material includes a red colorant, a blue colorant, a yellow colorant, and a violet colorant (4) An aspect in which the coloring material includes a red colorant, a blue colorant, a yellow colorant, a violet colorant, and a green colorant (5) An aspect in which the coloring material includes a red colorant, a blue colorant, a yellow colorant, and a green colorant (6) An aspect in which the coloring material includes a red colorant, a blue colorant, and a green colorant (7) An aspect in which the coloring material includes a yellow colorant and a violet colorant In the aspect (1), a mass ratio red colorant:blue colorant between the red colorant and the blue colorant is preferably 20 to 80:20 to 80, more preferably 20 to 60:40 to 80, and more preferably 20 to 50:50 to 80.

In the aspect (2), a mass ratio red colorant:blue colorant: yellow colorant between the red colorant, the blue colorant, and the yellow colorant is preferably 10 to 80:20 to 80:10 to 40, more preferably 10 to 60:30 to 80:10 to 30, and still more preferably 10 to 40:40 to 80:10 to 20.

In the aspect (3), a mass ratio red colorant:blue colorant: yellow colorant:violet colorant between the red colorant, the blue colorant, the yellow colorant, and the violet colorant is preferably 10 to 80:20 to 80:5 to 40:5 to 40, more preferably 10 to 60:25 to 80:5 to 30:5 to 30, and still more preferably 10 to 40:25 to 50:10 to 30:10 to 30.

In the aspect (4), a mass ratio red colorant:blue colorant: yellow colorant:violet colorant:green colorant between the red colorant, the blue colorant, the yellow colorant, the violet colorant, and the green colorant is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the aspect (5), a mass ratio red colorant:blue colorant: yellow colorant:green colorant between the red colorant, the blue colorant, the yellow colorant, and the green colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (6), a mass ratio red colorant:blue colorant: green colorant between the red colorant, the blue colorant, and the green colorant is preferably 10 to 80:20 to 80:10 to 40, more preferably 10 to 60:30 to 80:10 to 30, and still more preferably 10 to 40:40 to 80:10 to 20.

In the aspect (7), a mass ratio yellow colorant:violet colorant between the yellow colorant and the violet colorant is preferably 10 to 50:40 to 80, more preferably 20 to 40:50 to 70, and still more preferably 30 to 40:60 to 70.

As the yellow colorant, C.I. Pigment Yellow 139, 150, or 185 is preferable, C.I. Pigment Yellow 139 or 150 is more preferable, and C.I. Pigment Yellow 139 is still more preferable. As the blue colorant, C.I. Pigment Blue 15:6 is preferable. As the violet colorant, for example, C.I. Pigment Violet 23 is preferable. As the red colorant, C.I. Pigment Red 122, 177, 224, or 254 is preferable, C.I. Pigment Red 122, 177, or 254 is more preferable, and C.I. Pigment Red 254 is still more preferable. As the green colorant, C.I. Pigment Green 7, 36, 58, or 59 is preferable.

(Organic Black Colorant)

In the present invention, examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available.

Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In the present invention, it is preferable that the bisbenzofuranone compound is one of the following compounds represented by the following formulae or a mixture thereof.

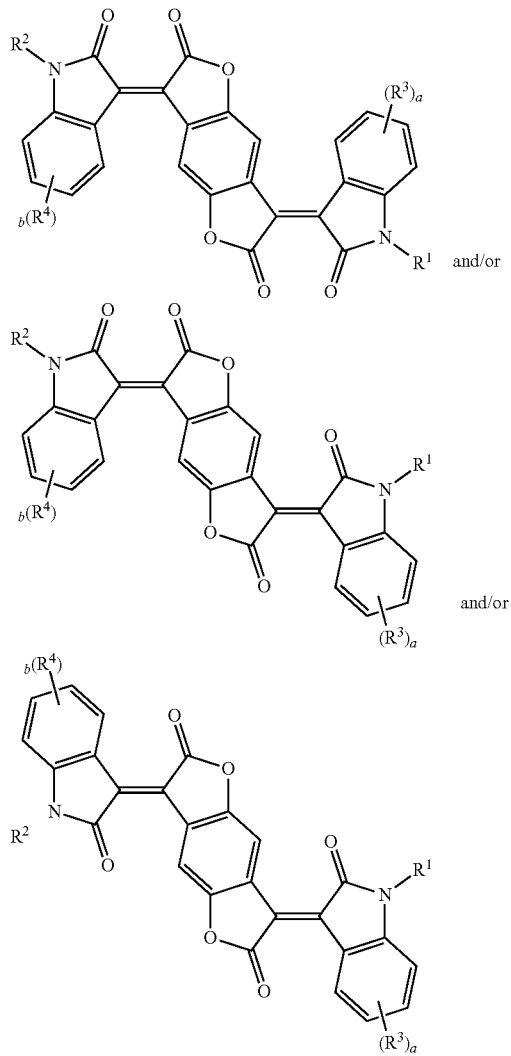

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$COOR^{303}$, —$OCOR^{304}$, —$NR^{305}R^{306}$, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$, $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In the present invention, in a case where an organic black colorant is used as the coloring material, it is preferable that the organic black colorant is used in combination with a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination. In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

In the present invention, the content of the pigment in the coloring material is preferably 95 mass % or higher, more preferably 97 mass % or higher, and still more preferably 99 mass % or higher with respect to the total mass of the coloring material.

In the composition according to the embodiment of the present invention, the content of the coloring material is preferably 10 to 70 mass % with respect to the total solid content of the composition. The lower limit is preferably 30 mass % or higher and more preferably 40 mass % or higher.

<<Near Infrared Absorber>>

The composition according to the embodiment of the present invention can include a near infrared absorber. In an infrared transmitting filter, the near infrared absorber has a function of limiting light to be transmitted (infrared light) to a longer wavelength side.

In the present invention, as the near infrared absorber, a compound having a maximum absorption wavelength in a near infrared range (preferably a wavelength range of longer than 700 nm and 1300 nm or shorter) can be preferably used. As the near infrared absorber, a pigment or a dye may be used.

In the present invention, as the near infrared absorber, a near infrared absorbing compound that includes a π-conjugated plane having a monocyclic or fused aromatic ring can be preferably used. The number of atoms constituting the π-conjugated plane included in the near infrared absorbing compound other than hydrogen is preferably 14 or more, more preferably 20 or more, still more preferably 25 or more, and still more preferably 30 or more. For example, the upper limit is preferably 80 or less and more preferably 50 or less.

The number of monocyclic or fused aromatic rings in the π-conjugated plane included in the near infrared absorbing compound is preferably 2 or more, more preferably 3 or more, still more preferably 4 or more, and still more preferably 5 or more. The upper limit is preferably 100 or less, more preferably 50 or less, and still more preferably 30 or less. Examples of the aromatic ring include a benzene ring, a naphthalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

It is preferable that the near infrared absorbing compound is a compound having a maximum absorption wavelength in a wavelength range of 700 to 1000 nm. In this specification, "having a maximum absorption wavelength in a wavelength range of 700 to 1000 nm" denotes having a maximum absorbance in a wavelength range of 700 to 1000 nm in an absorption spectrum of the near infrared absorbing compound in a solution. Examples of a measurement solvent used for the measurement of the absorption spectra of the near infrared absorbing compound in the solution include chloroform, methanol, dimethyl sulfoxide, ethyl acetate, and tetrahydrofuran. In the case of a compound which is soluble in chloroform, chloroform is used as the measurement solvent. In the case of a compound which is not soluble in chloroform, methanol is used. In addition, in a case where the near infrared absorbing colorant is a compound which is not soluble in chloroform and methanol, dimethyl sulfoxide is used.

In the present invention, as the near infrared absorbing compound, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrrolomethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a diimmonium compound is more preferable, at least one selected from a pyrrolopyrrole compound, a cyanine compound, a squarylium compound is still more preferable, and a pyrrolopyrrole compound is still more preferable. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, a compound described in paragraphs "0013" to "0029" of JP2013-195480A, vanadium phthalocyanine described in JP6081771B, the contents of which are incorporated herein by reference. As the phthalocyanine compound, for example, a compound having the following structure can also be used. Examples of the naphthalocyanine compound include a compound described in paragraph "0093" of JP2012-077153A, the content of which is incorporated herein by reference. In addition, as the cyanine compound, the phthalocyanine compound, the naphthalocyanine compound, the diimmonium compound, or the squarylium compound, for example, a compound described in paragraphs "0010" to "0081" of JP2010-111750A may be used, the content of which is incorporated herein by reference. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. In addition, a compound described in paragraphs JP2016-146619A can also be used as the near infrared absorbing compound, the content of which is incorporated herein by reference.

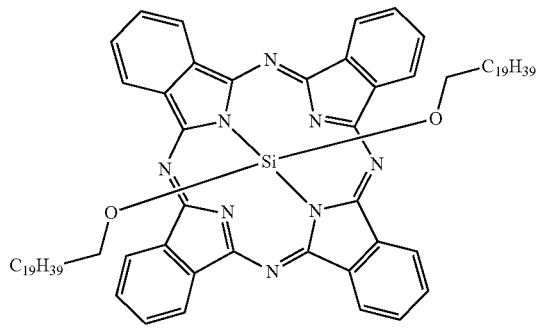

As the pyrrolopyrrole compound, a compound represented by Formula (PP) is preferable.

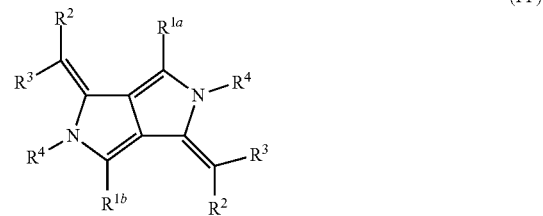

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

In Formula (PP), $R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ and $R^{1b}$ may have a substituent or may be unsubstituted. Examples of the substituent include substituents described in paragraphs "0020" to "0022" of 2009-263614A and the following substituent T. In addition, in a case where the alkyl group, the aryl group, and the heteroaryl group represented by $R^{1a}$ and $R^{1b}$ has two or more substituents, the substituents may be bonded to each other to form a ring.

(Substituent T)

The substituent T includes an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxyl group, a carboxyl group, a sulfo group, a phosphate group, a carboxylic acid amide group (preferably a group represented by —NHCOR$^{41}$; R$^{41}$ represents a hydrocarbon group or a heterocyclic group, and the hydrocarbon group and the heterocyclic group may further have a substituent; as the substituent, a halogen atom is preferable, and a fluorine atom is more preferable), a sulfonic acid amide group (preferably a group represented by —NHSO$_2$R$^{42}$; R$^{42}$ represents a hydrocarbon group or a heterocyclic group, and the hydrocarbon group and the heterocyclic group may further have a substituent; as the substituent, a halogen atom is preferable, and a fluorine atom is more preferable), an imide acid group (preferably a group represented by —SO$_2$NHSO$_2$R$^{43}$, —CONHSO$_2$R$^{44}$, —CONHCOR$^{45}$, or —SO$_2$NHCOR$^{46}$; R$^{43}$ to R$^{46}$ each independently represent a hydrocarbon group or a heterocyclic group; the hydrocarbon group and the heterocyclic group may further have a substituent), a mercapto group, a halogen atom, a cyano group, an alkylsulfino group, an arylsulfino group, a hydrazino group, an imino group, and a heteroaryl group (preferably having 1 to 30 carbon atoms).

In a case where the above-described groups can be further substituted, the groups may further have a substituent. Examples of the substituent include the groups described regarding the substituent T.

Specific examples of the group represented by R$^{1a}$ and R$^{1b}$ include an aryl group which has an alkoxy group as a substituent, an aryl group which has a hydroxyl group as a substituent, and an aryl group which has an acyloxy group as a substituent.

In Formula (PP), R$^2$ and R$^3$ each independently represent a hydrogen atom or a substituent. Examples of the substituent include the above-described substituent T. It is preferable that at least one of R$^2$ or R$^3$ represents an electron-withdrawing group. A substituent having a positive Hammett's substituent constant a value (sigma value) acts as an electron-withdrawing group. Here, the substituent constant obtained by Hammett's rule includes a σp value and a σm value. The values can be found in many common books. In the present invention, a substituent having the Hammett's substituent constant σ value of 0.2 or more can be exemplified as the electron-withdrawing group. σ value is preferably 0.25 or more, more preferably 0.3 or more, and still more preferably 0.35 or more. The upper limit is not particularly limited, but preferably 0.80 or less. Specific examples of the electron-withdrawing group include a cyano group (σp value=0.66), a carboxyl group (—COOH: σp value=0.45), an alkoxycarbonyl group (for example, —COOMe: σp value=0.45), an aryloxycarbonyl group (for example, —COOPh: σp value=0.44), a carbamoyl group (for example, —CONH$_2$: σp value=0.36), an alkylcarbonyl group (for example, —COMe: σp value=0.50), an arylcarbonyl group (for example, —COPh: σp value=0.43), an alkylsulfonyl group (for example, —SO$_2$Me: σp value=0.72), and an arylsulfonyl group (for example, —SO$_2$Ph: σp value=0.68). Among these, a cyano group is preferable. Here, Me represents a methyl group, and Ph represents a phenyl group. For example, the Hammett's substituent constant σ value can be found in the description of paragraphs "0017" and "0018" of JP2011-068731A, the content of which is incorporated herein by reference.

In Formula (PP), it is preferable that R$^2$ represents an electron-withdrawing group (preferably a cyano group) and R$^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two R$^2$'s in Formula (PP) may be the same as or different from each other. In addition, two R$^3$'s in Formula (PP) may be the same as or different from each other.

In Formula (PP), R$^4$ represents preferably a hydrogen atom, an alkyl group, an aryl group, a heteroaryl group, or a group represented by —BR$^{4A}$R$^{4B}$, more preferably a hydrogen atom, an alkyl group, an aryl group, or a group represented by —BR$^{4A}$R$^{4B}$, and still more preferably a group represented by —BR$^{4A}$R$^{4B}$. As the substituent represented by R$^{4A}$ and R$^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two R$^4$'s in Formula (PP) may be the same as or different from each other. R$^{4A}$ and R$^{4B}$ may be bonded to each other to form a ring.

Specific examples of the compound represented by Formula (PP) include the following compounds. In the following structural formulae, Me represents a methyl group, and Ph represents a phenyl group. In addition, Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference.

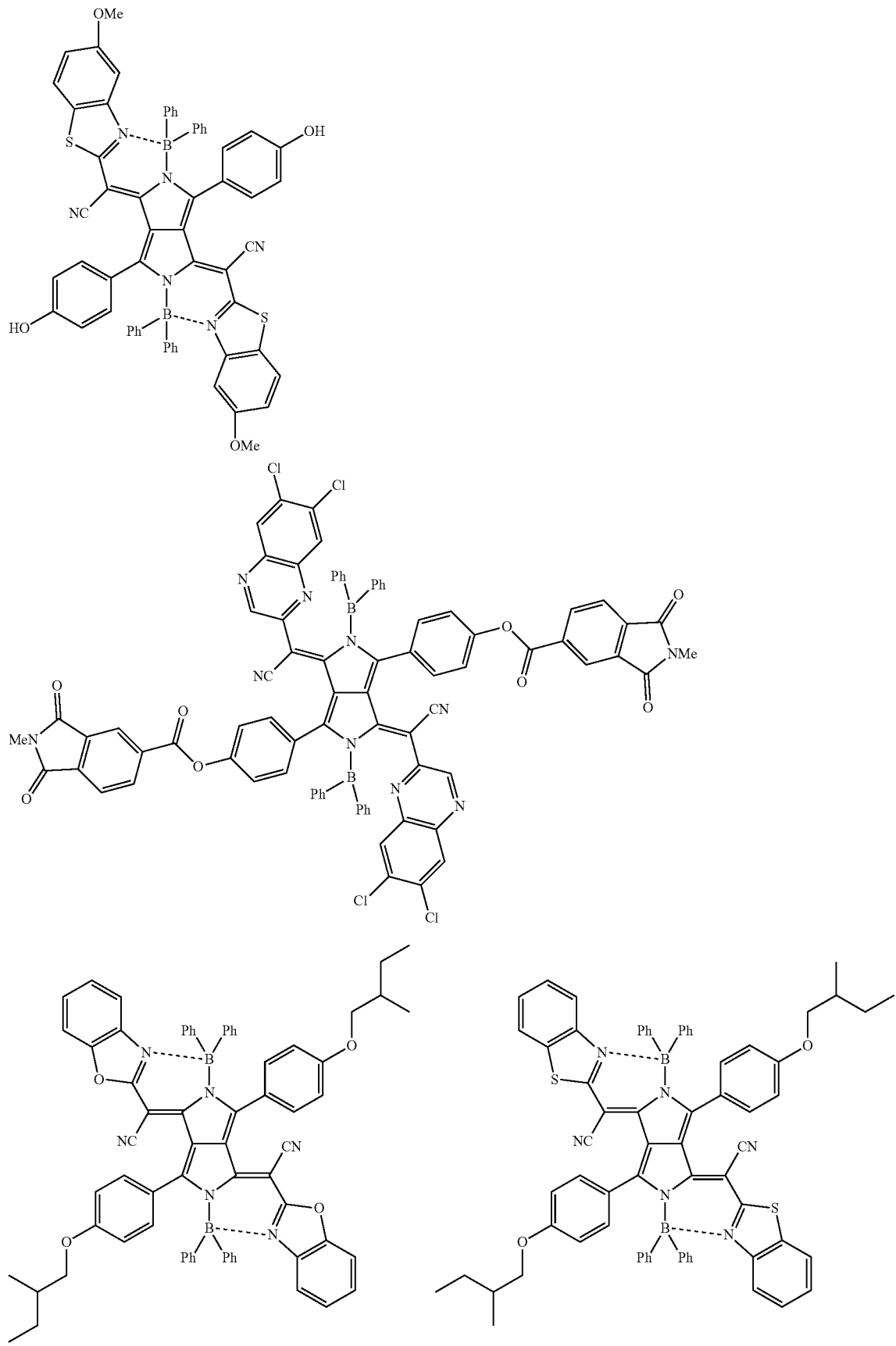

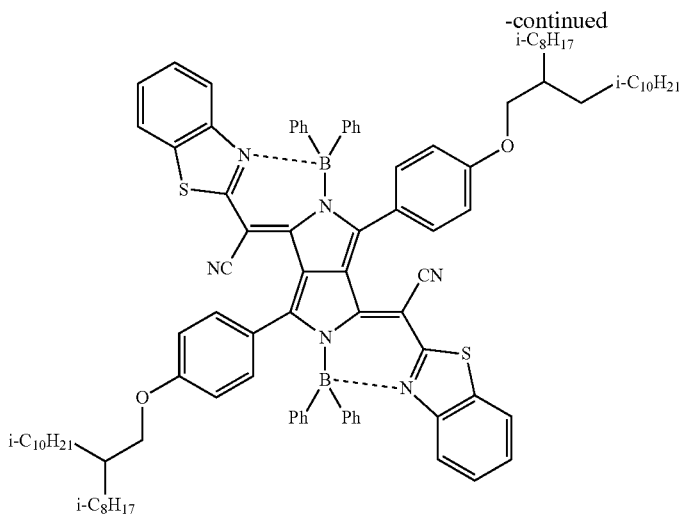

As the squarylium compound, a compound represented by the following Formula (SQ) is preferable.

In Formula (SQ), $A^1$ and $A^2$ each independently represent an aryl group, a heteroaryl group, or a group represented by the following Formula (A-1).

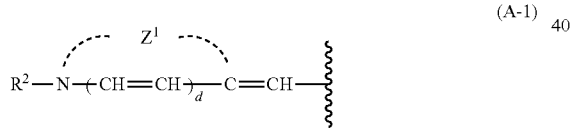

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond. The details of Formula (SQ) can be found in paragraphs "0020" to "0049" of JP2011-208101A, paragraphs "0043" to "0062" of JP6065169B, and paragraphs "0024" to "0040" of WO2016/181987A, the contents of which are incorporated herein by reference.

As shown below, cations in Formula (SQ) are present without being localized.

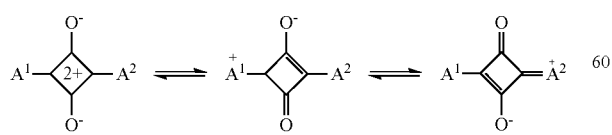

Examples of the squarylium compound include a compound having the following structure. In addition, examples of the squarylium compound include a compound described in paragraphs "0044" to "0049" of JP2011-208101A, a compound described in paragraphs "0060" and "0061" of JP6065169B, a compound described in paragraph "0040" of WO2016/181987A, a compound described in WO2013/133099A, a compound described in WO2014/088063A, a compound described in JP2014-126642A, a compound described in JP2016-146619A, a compound described in JP2015-176046A, a compound described in JP2017-025311A, a compound described in WO2016/154782A, a compound described in JP5884953B, a compound described in JP6036689B, a compound described in JP5810604B, and a compound described in JP2017-068120A, the contents of which are incorporated herein by reference.

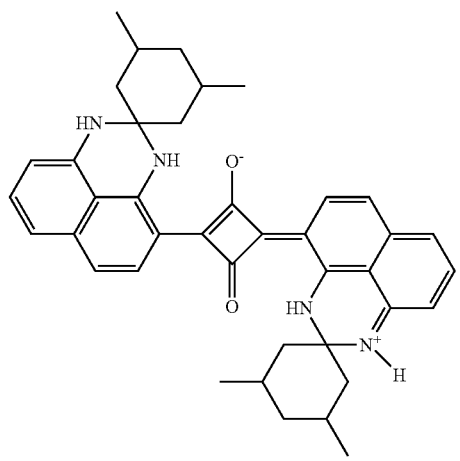 [SMILES: CC1CC(C)CC2(C1)Nc1cccc3ccc(C4=C([O-])/C(=c5\ccc6cccc7c6c5NC5(CC(C)CC(C)C5)[NH+]=7)C4=O)c(c13)N2]

As the cyanine compound, a compound represented by Formula (C) is preferable.

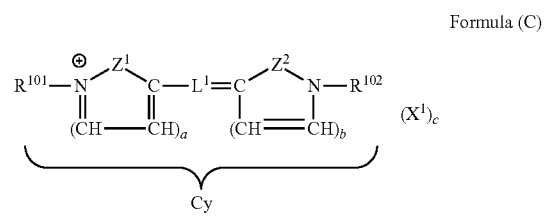

In the formula, $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In addition, examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, a compound described in JP2008-088426A, and a compound described in JP2017-031394A, the contents of which are incorporated herein by reference.

In the present invention, as the near infrared absorbing compound, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the composition according to the embodiment of the present invention, as the near infrared absorber, inorganic particles can also be used. The shape of the inorganic particles is not particularly limited and may have a sheet shape, a wire shape, or a tube shape irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In the composition according to the embodiment of the present invention, the content of the near infrared absorber is preferably 1 to 30 mass % with respect to the total solid content of the composition. The upper limit is preferably 20 mass % or lower, and more preferably 10 mass % or lower. The lower limit is preferably 3 mass % or higher and more preferably 5 mass % or higher.

In addition, the total content of the near infrared absorber and the coloring material is preferably 10 to 70 mass % with respect to the total solid content of the composition. The lower limit is preferably 20 mass % or higher and more preferably 25 mass % or higher.

In addition, the content of the near infrared absorber is preferably 5 to 40 mass % with respect to the total content of the near infrared absorber and the coloring material. The upper limit is preferably 30 mass % or lower and more preferably 25 mass % or lower. The lower limit is preferably 10 mass % or higher and more preferably 15 mass % or higher.

In the composition according to the embodiment of the present invention, as the near infrared absorber, one infrared absorber may be used alone, or two or more infrared absorbers may be used in combination. In a case where two or more near infrared absorbers are used in combination, it is preferable that the total content of the near infrared absorbers is in the above-described range.

<<Polymerizable Compounds>>

The composition according to the embodiment of the present invention includes the polymerizable compound. As the polymerizable compound, a compound that is polymerizable by the action of a radical is preferable. That is, it is preferable that the polymerizable compound is a radically polymerizable compound. As the polymerizable compound, a compound having two or more ethylenically unsaturated groups is preferable, and a compound having three or more ethylenically unsaturated groups is more preferable. The upper limit of the number of the ethylenically unsaturated groups is, for example, preferably 15 or less and more preferably 6 or less. Examples of the ethylenically unsaturated group include a vinyl group, a styrene group, a (meth)allyl group, a (meth)acryloyl group, and a (meth)acryloyloxy group.

The polymerizable compound may be in the form of a monomer or a polymer and is preferably a monomer. The molecular weight of the monomer type polymerizable compound is preferably 100 to 3000. The upper limit is preferably 2000 or lower and more preferably 1500 or lower. The lower limit is preferably 150 or higher and more preferably 250 or higher. In addition, it is preferable that the polymerizable compound is a compound substantially not having a molecular weight distribution. Here, the compound substantially not having a molecular weight distribution represents that the dispersity (weight-average molecular weight (Mw)/number-average molecular weight (Mn)) of the compound is preferably 1.0 to 1.5 and more preferably 1.0 to 1.3.

The polymerizable compound used in the present invention includes a compound A having an alkyleneoxy group and three ethylenically unsaturated groups (hereinafter, also simply referred to as "compound A").

The content of the compound A is preferably 50 to 100 mass % with respect to the total mass of the polymerizable compound used in the present invention. The lower limit is preferably 55 mass % or higher and more preferably 60 mass % or higher. In a case where the content of the compound A is 50 mass % or higher, the effects of the present invention are more significantly exhibited.

The molecular weight of the compound A is preferably 380 to 600. The upper limit is preferably 560 or lower and more preferably 516 or lower. The lower limit is preferably 384 or higher and more preferably 400 or higher. It is preferable that the compound A is a monomer.

The C=C value of the compound A is preferably 5.0 to 10.7 mmol/g. The lower limit is preferably 5.5 mmol/g or higher, more preferably 6.0 mmol/g or higher, and still more preferably 6.5 mmol/g or higher. In a case where the C=C value of the compound A is in the above-described range, a fine pattern is likely to be formed with excellent adhesiveness. The upper limit is preferably 10.0 mmol/g or lower. The C=C value of the compound A is calculated by dividing the number of ethylenically unsaturated groups included in one molecule of the compound A by the molecular weight of the compound A.

The compound A is preferably a compound having 2 to 6 alkyleneoxy groups and more preferably a compound having 3 to 6 alkyleneoxy groups. The number of carbon atoms in the alkyleneoxy group is preferably 1 to 10, more preferably 1 to 5, still more preferably 1 to 3, still more preferably 2 or 3, and most preferably 2.

The compound A is preferably a compound represented by the following formula (A-1).

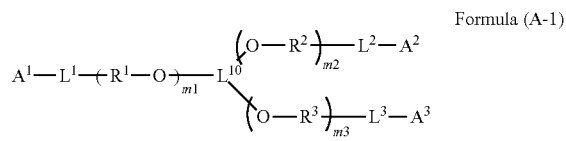

Formula (A-1)

In the formula, $A^1$ to $A^3$ each independently represent an ethylenically unsaturated group, $L^1$ to $L^3$ each independently represent a single bond or a divalent linking group, $R^1$ to $R^3$ each independently represent an alkylene group, m1 to m3 each independently represent an integer of 0 to 10, $L^{10}$ represents a trivalent linking group, and the sum of m1, m2, and m3 is 1 or more.

Examples of the ethylenically unsaturated group represented by $A^1$ to $A^3$ include a vinyl group, a (meth)allyl group, a (meth)acryloyl group, and a (meth)acryloyloxy group.

Examples of the divalent linking group represented by $L^1$ to $L^3$ include an alkylene group, an arylene group, —O—, —CO—, —COO—, —OCO—, —NH—, and a group including a combination of two or more thereof. The number of carbon atoms in the alkylene group is preferably 1 to 30, more preferably 1 to 20, and still more preferably 1 to 15. The alkylene group may be linear, branched, or cyclic. The number of carbon atoms in the arylene group is preferably 6 to 30, more preferably 6 to 20, and still more preferably 6 to 10.

The number of carbon atoms in the alkylene group represented by $R^1$ to $R^3$ is preferably 1 to 10, more preferably 1 to 5, still more preferably 1 to 3, still more preferably 2 or 3, and most preferably 2. The alkylene group represented by $R^1$ is preferably linear or branched and more preferably linear. Specific examples of the alkylene group represented by $R^1$ include an ethylene group and a linear or branched propylene group. Among these, an ethylene group is preferable.

m1 to m3 each independently represent preferably an integer of 0 to 10, more preferably 0 to 5, still more preferably 0 to 7, and still more preferably 0 to 3. In addition, the sum of m1, m2, and m3 is 1 or more, preferably 2 or more, and still more preferably 3 or more. The upper limit is preferably 20 or less, more preferably 10 or less, and still more preferably 6 or less. In addition, the sum of m1, m2, and m3 is preferably 2 to 6 and more preferably 3 to 6.

Examples of the trivalent linking group represented by $L^{10}$ include an aliphatic hydrocarbon group, an aromatic hydrocarbon group, a heterocyclic group, a group of a combination thereof, and a group of a combination of at least one selected from an aliphatic hydrocarbon group, an aromatic hydrocarbon group, or a heterocyclic group and at least one selected from —O—, —CO—, —COO—, —OCO—, or —NH—. Among these, an aliphatic hydrocarbon group is preferable. The number of carbon atoms in the aliphatic hydrocarbon group is preferably 1 to 30, more preferably 1 to 20, and still more preferably 1 to 15. The aliphatic hydrocarbon group represented by $L^{10}$ may be linear, branched, or cyclic and is preferably branched. The number of carbon atoms in the aromatic hydrocarbon group is preferably 6 to 30, more preferably 6 to 20, and still more preferably 6 to 10. The heterocyclic group may be a non-aromatic heterocyclic group or an aromatic heterocyclic group. It is preferable that the heterocyclic group is a 5- or 6-membered ring. Examples of the kind of the heteroatom constituting the heterocyclic group include a nitrogen atom, an oxygen atom, and a sulfur atom. The number of heteroatoms constituting the heterocyclic group is preferably 1 to 3. The heterocyclic group may be a monocycle or a fused ring. The aliphatic hydrocarbon group, the aromatic hydrocarbon group, and the heterocyclic group may have a substituent. Examples of the substituent include the groups described regarding the substituent T.

The compound A is more preferably a compound represented by the following formula (A-2).

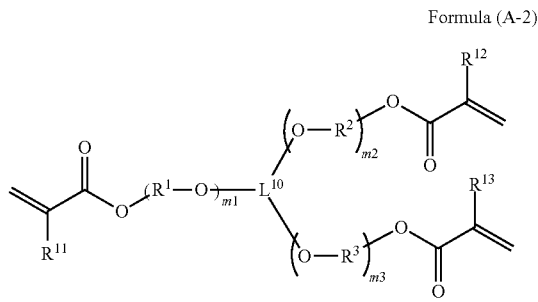

Formula (A-2)

In the formula, $R^{11}$ to $R^{13}$ each independently represent a hydrogen atom or a methyl group, $R^1$ to $R^3$ each independently represent an alkylene group, m1 to m3 each independently represent an integer of 0 to 10, $L^{10}$ represents a trivalent linking group, and the sum of m1, m2, and m3 is 1 or more. $R^{11}$ to $R^{13}$, $L^{10}$, and m1 to m3 in Formula (A-2) have the same definitions and the same preferable ranges as $R^{11}$ to $R^{13}$, $L^{10}$, and m1 to m3 in Formula (A-1).

In the present invention, as the compound A, one kind may be used alone, or a combination of two or more kinds may be used. In addition, in a case where two or more compounds A are used in combination, it is preferable that compounds having different numbers of alkyleneoxy groups are used in combination. In a case where two or more compounds having different numbers of alkyleneoxy groups are used in combination, a finer pattern can be formed with excellent adhesiveness.

In addition, in a case where two or more compounds A are used in combination, the average number of alkyleneoxy groups in the compounds A is preferably 2 to 10, more preferably 3 to 10, still more preferably 3 to 6, and still more preferably 3 to 5.

In addition, it is preferable that the compound A includes a compound having three alkyleneoxy groups and a compound having 4 to 6 alkyleneoxy groups, it is more preferable that the content of the compound having 4 to 6 alkyleneoxy groups is 20 to 500 parts by mass with respect to 100 parts by mass of the compound having three alkyleneoxy groups, it is still more preferable that the content of the compound having 4 to 6 alkyleneoxy groups is 20 to 300 parts by mass with respect to 100 parts by mass of the compound having three alkyleneoxy groups, and it is still more preferable that the content of the compound having 4 to 6 alkyleneoxy groups is 20 to 200 parts by mass with respect to 100 parts by mass of the compound having three alkyleneoxy groups. According to this aspect, a finer pattern can be formed with excellent adhesiveness.

As the polymerizable compound, in addition to the above-described compound A, the composition according to the embodiment of the present invention may further include a compound having four or more ethylenically unsaturated groups (hereinafter, also referred to as "compound B"). The compound B is preferably a compound having 4 to 15 ethylenically unsaturated groups, more preferably a compound having 4 to 10 ethylenically unsaturated groups, and still more preferably a compound having 4 to 6 ethylenically unsaturated groups. The compound B is preferably a (meth)acrylate having four or more functional groups.

Examples of the compound B include compounds described in paragraphs "0095" to "0108" of JP2009-288705A, paragraph "0227" of JP2013-29760 and paragraphs "0254" to "0257" of JP2008-292970A, the content of which is incorporated herein by reference.

As the compound B, dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product; manufactured by Shin-Nakamura Chemical Co., Ltd.), and a compound (for example, SR454 or SR499; manufactured by Sartomer) having a structure in which these (meth)acryloyl groups are bonded through an ethylene glycol or a propylene glycol residue is preferable. Oligomers of the above-described examples can be used. In addition, KAYARAD RP-1040 or DPCA-20 (manufactured by Nippon Kayaku Co., Ltd.) can also be used. In addition, ARONIX M-402, ARONIX TO-1382, or ARONIX TO-2349 (all of which are trade names; manufactured by Toagosei Co., Ltd.) can also be used.

The compound B may further have an acid group such as a carboxyl group, a sulfo group, or a phosphate group. Examples of a commercially available product include ARONIX M-305, M-510, and M-520 (manufactured by Toagosei Co., Ltd.). The acid value of the compound B is preferably 0.1 to 40 mgKOH/g. The lower limit is preferably 5 mgKOH/g or higher. The upper limit is preferably 30 mgKOH/g or lower.

In addition, it is also preferable that the compound B is a compound having a caprolactone structure. Examples of the polymerizable compound having a caprolactone structure can be found in paragraphs "0042" to "0045" of JP2013-253224A, the content of which is incorporated herein by reference.

The compound B is preferably a compound having an alkyleneoxy group. Examples of the alkyleneoxy group include an ethyleneoxy group and a propyleneoxy group. Among these, an ethyleneoxy group is preferable.

As the compound B, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. In addition, a compound described in JP2017-048367A, JP6057891B, or JP6031807B can also be used. Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In the composition according to the embodiment of the present invention, the content of the polymerizable compound is preferably 0.1 to 50 mass % with respect to the total solid content of the composition. For example, the lower limit is more preferably 0.5 mass % or higher and still more preferably 1 mass % or higher. For example, the upper limit is more preferably 45 mass % or lower and still more preferably 40 mass % or lower.

In addition, in the composition according to the embodiment of the present invention, the content of the compound A is preferably 0.1 to 50 mass % with respect to the total solid content of the composition. For example, the lower limit is more preferably 0.5 mass % or higher and still more preferably 1 mass % or higher. For example, the upper limit is more preferably 45 mass % or lower and still more preferably 40 mass % or lower.

<<Photopolymerization Initiator>>

The composition according to the embodiment of the present invention includes the photopolymerization initiator. The photopolymerization initiator is not particularly limited and can be appropriately selected from well-known photopolymerization initiators. For example, a compound having photosensitivity to light in a range from an ultraviolet range to a visible range is preferable. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-arylsubstituted coumarin compound is preferable, a compound selected from the group consisting of an oxime compound, an a-hydroxyketone compound, an α-aminoketone compound, and an acylphosphine compound is more preferable, and an oxime compound is still more preferable. The details of the photopolymerization initiator can be found in paragraphs "0065" to "0111" of JP2014-130173A, the content of which is incorporated herein by reference.

Examples of a commercially available product of the a-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

As the oxime compound, a compound described in JP2001-233842A, a compound described in JP2000-080068A, a compound described in JP2006-342166A, or a compound described in JP2016-021012A can be used. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, JP2000-066385A, JP2000-080068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA OPTOMER N-1919 (manufactured by Adeka Corporation, a photopolymerization initiator 2 described in JP2012-014052A) can also be used. As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include OE-01 to OE-75 described in WO2015/036910A.

In the present invention, as the photopolymerization initiator, a photopolymerization initiator having two functional groups or three or more functional groups may be used. By using this photopolymerization initiator, two or more radicals are generated from one molecule of the photopolymerization initiator. Therefore, excellent sensitivity can be obtained. In addition, in a case where a compound having an asymmetric structure is used, crystallinity deteriorates, solubility in a solvent or the like is improved, precipitation is not likely to occur over time, and temporal stability of the composition can be improved. Specific examples of the photopolymerization initiator having two functional groups or three or more functional groups include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, Cmpd 1 to 7 described in WO2016/034963A, an oxime ester photoinitiator described in paragraph "0007" of JP2017-523465A, a photoinitiator described in paragraphs "0020" to "0033" of JP2017-167399A, and a photopolymerization initiator (A) described in paragraphs "0017" to "0026" of JP2017-151342A.

Specific examples of the oxime compound which are preferably used in the present invention are shown below, but the present invention is not limited thereto.

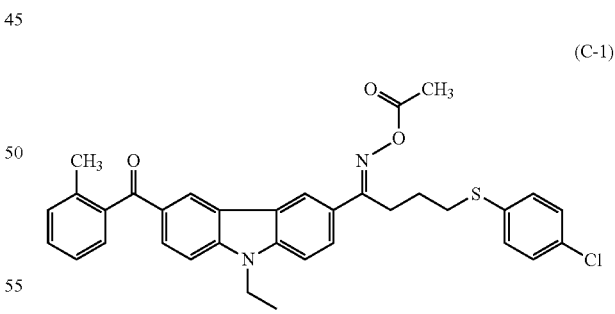

(C-1)

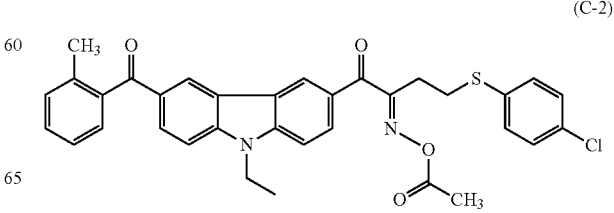

(C-2)

-continued
(C-3)
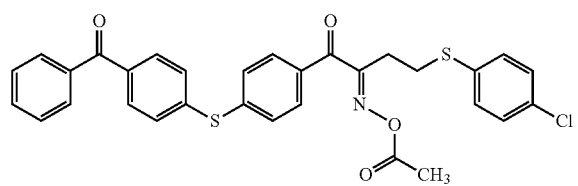
(C-4)
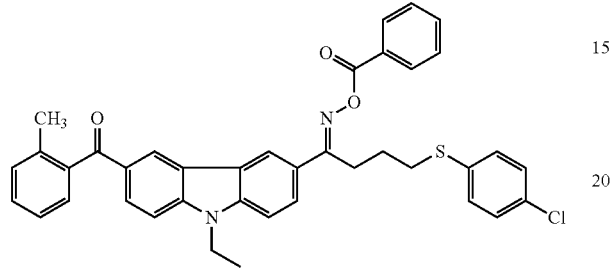
(C-5)
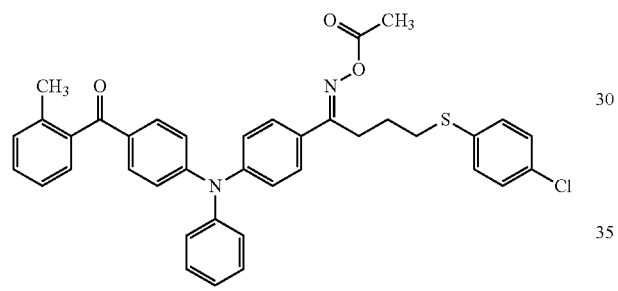
(C-4)
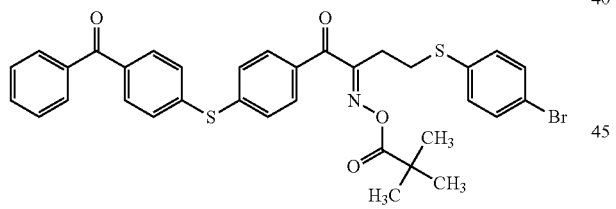
(C-7)
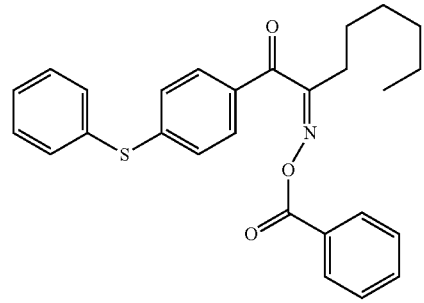
-continued
(C-8)
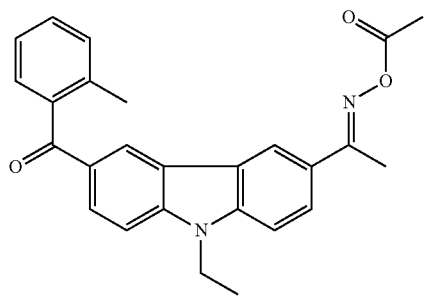
(C-9)
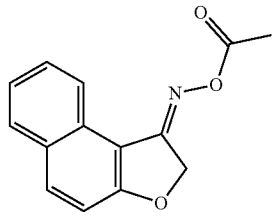
(C-10)
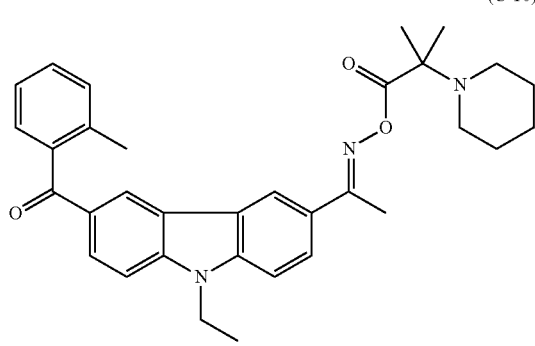
(C-11)
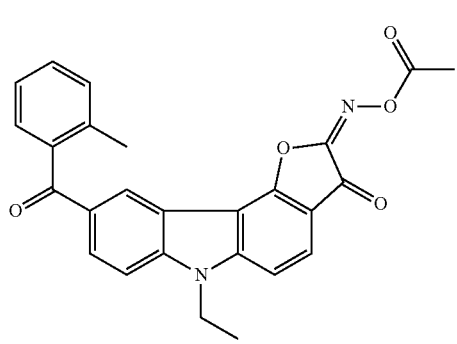
(C-12)
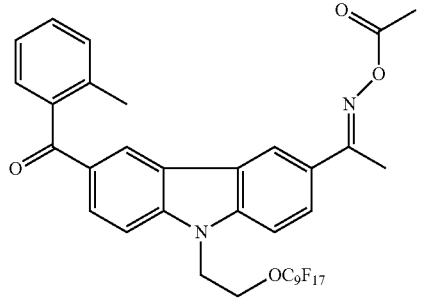

-continued

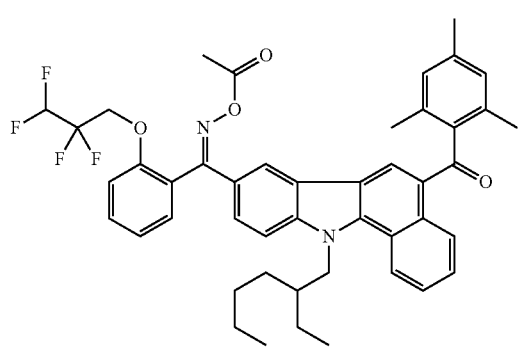
(C-13)

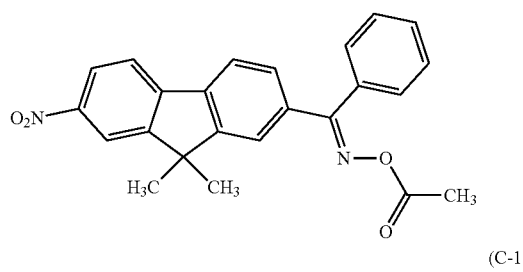
(C-14)

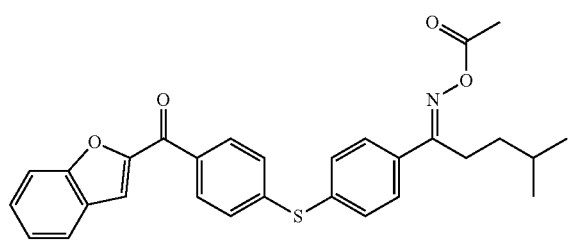
(C-15)

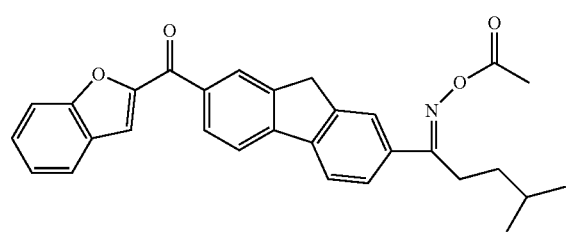
(C-16)

The photopolymerization initiator is preferably a compound having a molar absorption coefficient of 2000 L·mol$^{-1}$·cm$^{-1}$ or higher at a wavelength of 365 nm, more preferably a compound having a molar absorption coefficient of 5000 L·mol$^{-1}$·cm$^{-1}$ or higher at a wavelength of 365 nm, still more preferably a compound having a molar absorption coefficient of 7000 L·mol$^{-1}$·cm$^{-1}$ or higher at a wavelength of 365 nm, and still more preferably a compound having a molar absorption coefficient of 10000 L·mol$^{-1}$·cm$^{-1}$ or higher at a wavelength of 365 nm.

In the present invention, the molar absorption coefficient of the photopolymerization initiator at a wavelength of 365 nm is calculated by dissolving the photopolymerization initiator in a solvent to prepare a 5 mol % solution (measurement solution) of the photopolymerization initiator, and measuring an absorbance of the above-described measurement solution. Specifically, the molar absorption coefficient (L·mol$^{-1}$·cm$^{-1}$) at a wavelength of 365 nm is calculated by putting the above-described measurement solution into a glass cell having a width of 1 cm, measuring an absorbance thereof using g UV-Vis-NIR spectrophotometer (Cary 5000, manufactured by Agilent Technologies Inc.), and fitting the measured absorbance into the following expression.

$$\varepsilon = \frac{A}{cl}$$

In the expression, ε represents the molar absorption coefficient (L·mol$^{-1}$·cm$^{-1}$), A represents the absorbance, c represents the concentration (mol/L) of the measurement solution, and l represents an optical path length (cm).

In the measurement of the molar absorption coefficient of the photopolymerization initiator, examples of the solvent used for preparing the measurement solution include acetonitrile and chloroform. In a case where the photopolymerization initiator is a compound that is soluble in acetonitrile, the measurement solution is prepared using acetonitrile. In a case where the photopolymerization initiator is a compound that is soluble in acetonitrile and is not soluble in chloroform, the measurement solution is prepared using chloroform. In addition, in a case where the photopolymerization initiator is a compound that is not soluble in acetonitrile and chloroform and is soluble in dimethyl sulfoxide, the measurement solution is prepared using dimethyl sulfoxide.

Preferable examples of the photopolymerization initiator having a molar absorption coefficient of 5000 L·mol$^{-1}$·cm$^{-1}$ or higher at a wavelength of 365 nm include an oxime compound having a fluorine atom, an oxime compound having a nitro group, and an oxime compound having a benzofuran skeleton. Specific examples include the compounds (C-13), (C-15), and (C-16) described above as the specific examples of the oxime compound and ADEKA ARKLS NCI-831 (manufactured by Adeka Corporation).

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, developability is excellent. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

<<Resin>>

The composition according to the present invention may include a resin. In the present invention, the resin is mixed, for example, in order to disperse particles of the pigments and the like in the composition or to be added as a binder. The resin which is mainly used to disperse particles of the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. In addition, for example, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. In addition, as the resin, a resin described in Examples of WO2016/088645A, a resin described in JP2017-057265A, a resin described in JP2017-032685A, a resin described in JP2017-075248A, or a resin described in JP2017-066240A can also be used, the contents of which are incorporated herein by reference. In addition, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

The resin having an acid group may further have a polymerizable group. Examples of the polymerizable group include an allyl group, a methallyl group, and a (meth)acryloyl group. Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200

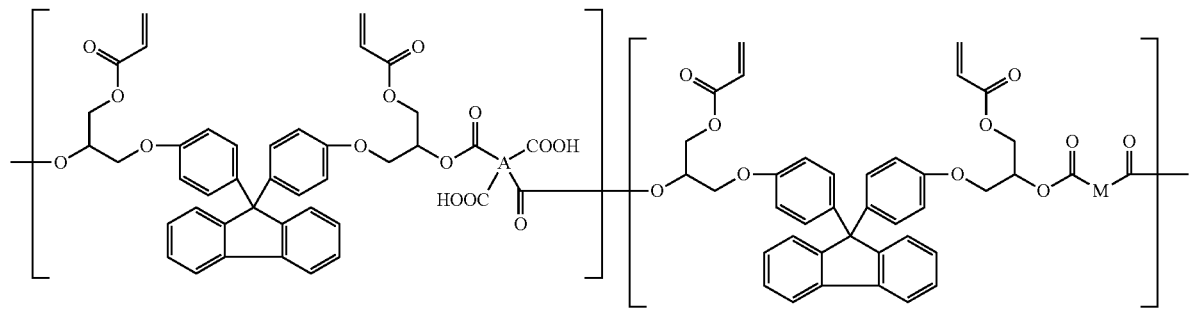

series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

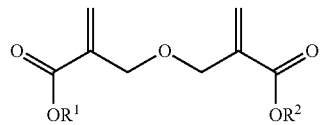

In Formula (ED1), $R^1$ and $R^2$ each independently represent a hydrogen atom or a hydrocarbon group having 1 to 25 carbon atoms which may have a substituent.

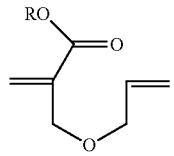

In Formula (ED2), R represents a hydrogen atom or an organic group having 1 to 30 carbon atoms. The details of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

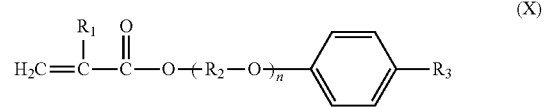

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

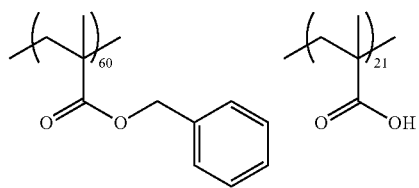
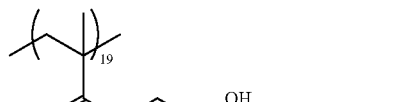
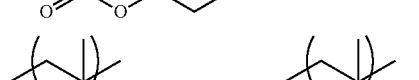
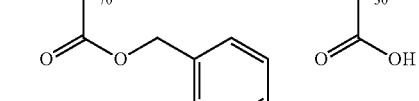
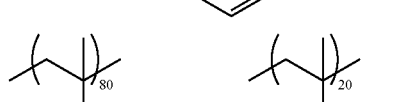
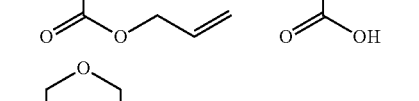
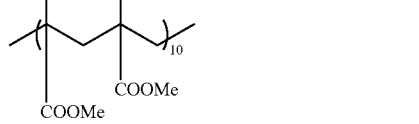
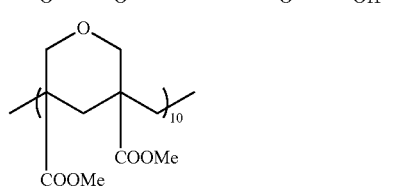

-continued

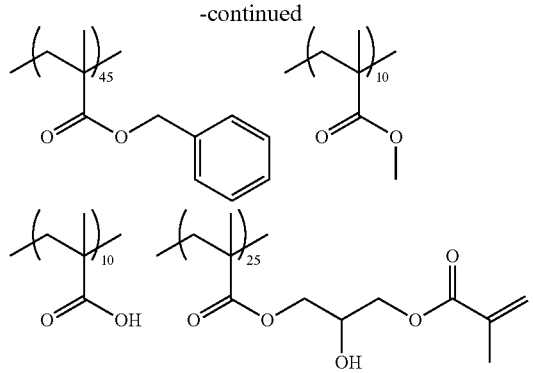

The composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

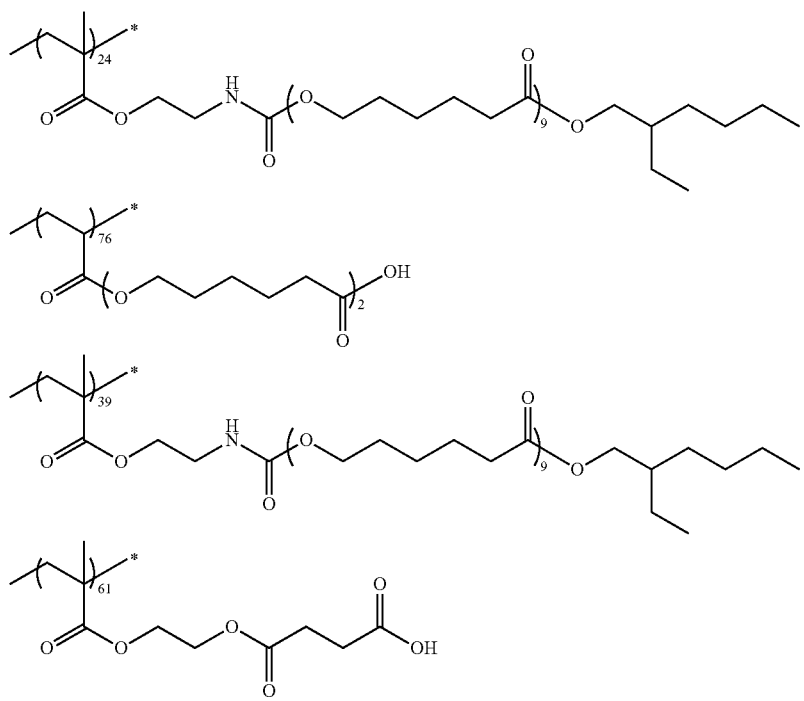

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. As the oligoimine dispersant, a resin having the following structure or a resin described in paragraphs "0168" to "0174" of JP2012-255128A can be used.

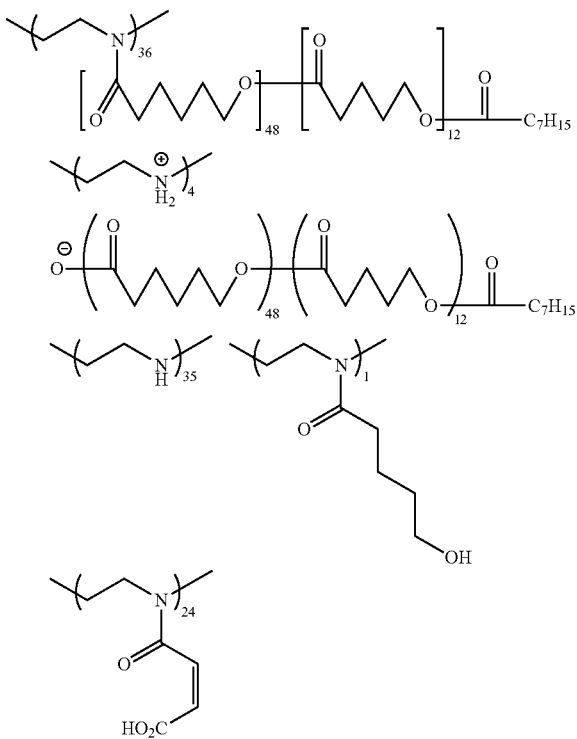

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

The content of the resin is preferably 1 to 50 mass % with respect to the total solid content of the composition according to the embodiment of the present invention. The lower limit is preferably 2 mass % or higher, more preferably 3 mass % or higher, still more preferably 5 mass % or higher, and still more preferably 10 mass % or higher. The upper limit is more preferably 40 mass % or lower, and still more preferably 30 mass % or lower. In addition, the content of the resin having an acid group is preferably 1 to 50 mass % with respect to the total solid content of the composition according to the embodiment of the present invention. The lower limit is preferably 2 mass % or higher, more preferably 3 mass % or higher, still more preferably 5 mass % or higher, and still more preferably 10 mass % or higher. The upper limit is more preferably 40 mass % or lower, and still more preferably 30 mass % or lower. The composition according to the embodiment of the present invention may include one resin or two or more resins. In a case where the composition includes two or more resins, it is preferable that the total content of the two or more resins is in the above-described range.

<<Pigment Derivative>>

The composition according to the embodiment of the present invention may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

The colorant structure represented by P is preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, or a benzoxazole colorant structure, more preferably at least one selected from a pyrrolopyrrole colorant structure, a diketo pyrrolopyrrole colorant structure, a quinacridone colorant structure, or a benzimidazolone colorant structure, and still more preferably a pyrrolopyrrole colorant structure.

Examples of the linking group represented by L include a hydrocarbon group, a heterocyclic group, —NR—, —$SO_2$—, —S—, —O—, —CO—, and a group of a combination thereof. R represents a hydrogen atom, an alkyl group, or an aryl group.

Examples of the acid group represented by X include a carboxyl group, a sulfo group, a carboxylic acid amide group, a sulfonic acid amide group, and an imide acid group. As the carboxylic acid amide group, a group represented by —$NHCOR^{X1}$ is preferable. As the sulfonic acid amide group, a group represented by —$NHSO_2R^{X2}$ is preferable. As the imide acid group, a group represented by —$SO_2NHSO_2R^{X3}$, —$CONHSO_2R^{X4}$, —$CONHCOR^{X5}$, or —$SO_2NHCOR^{X6}$ is preferable. $R^{X1}$ to $R^{X6}$ each independently represent a hydrocarbon group or a heterocyclic group. The hydrocarbon group and the heterocyclic group represented by $R^{X1}$ to $R^{X6}$ may further have a substituent. Examples of the substituent which may be further included include the substituent T described above regarding Formula (PP). Among these, a halogen atom is preferable and a fluorine atom is more preferable. Examples of the basic group represented by X include an amino group. Examples of the salt structure represented by X include a salt of the acid group or the basic group described above.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-

212088A), JP1994-240158A (JP-H6-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, paragraph "0082" of WO2017/038252A, and JP5299151B can be used, the contents of which are incorporated herein by reference.

pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it

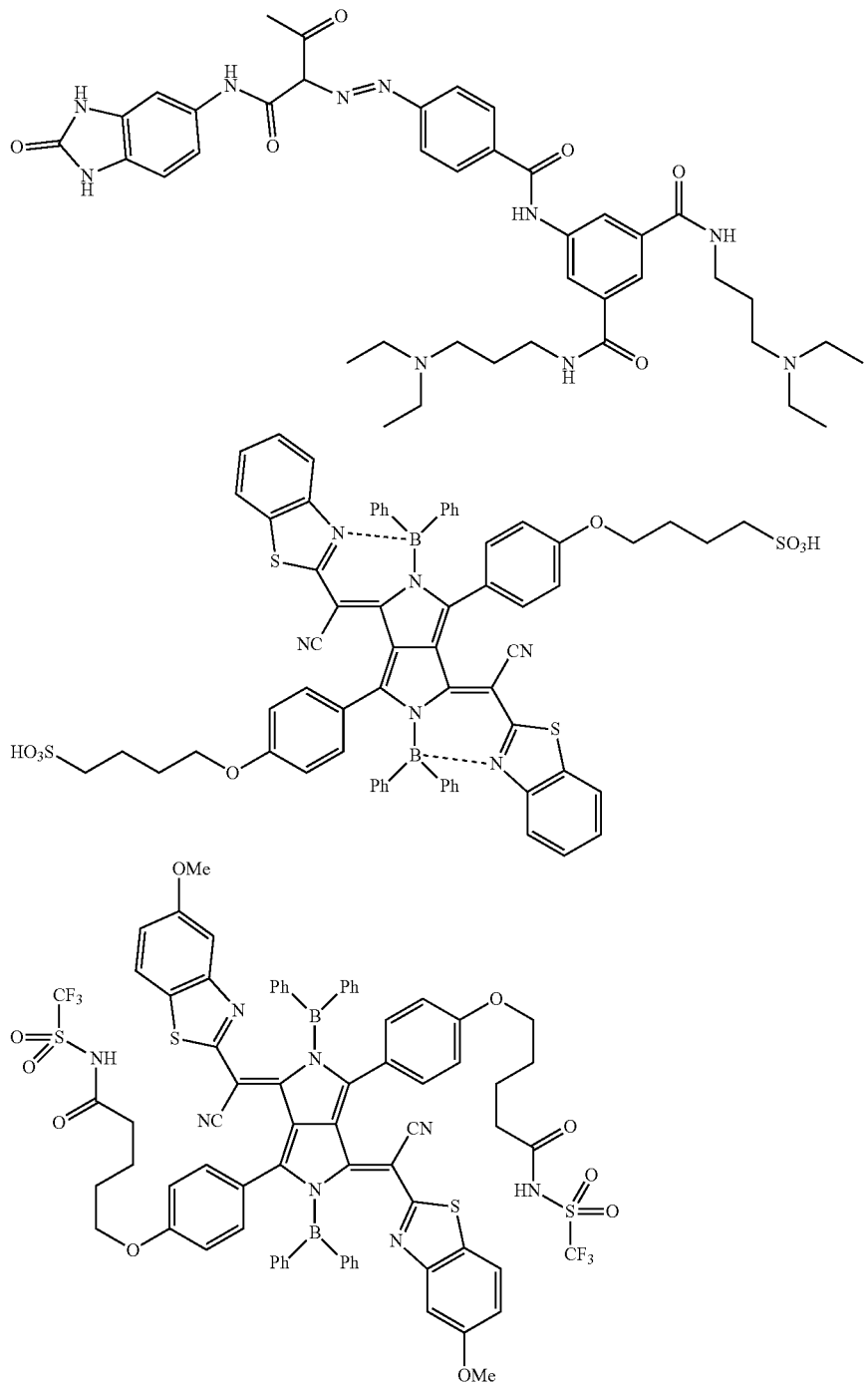

In a case where the composition according to the embodiment of the present invention includes the pigment derivative, the content of the pigment derivative is preferably 1 to 50 parts by mass with respect to 100 parts by mass of the is preferable that the total content of the two or more pigment derivatives is in the above-described range.

<<Solvent>>

The composition according to the embodiment of the present invention may include a solvent. Examples of the solvent include an organic solvent. Basically, the solvent is not particularly limited as long as it satisfies the solubility of the respective components and the coating properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the composition. In addition, due to the reasons of an environmental aspect, it may be preferable that the curable composition does not include an aromatic hydrocarbon (for example, benzene, toluene, xylene, or ethylbenzene) as a solvent.

<<Polymerization Inhibitor>>

The composition according to the embodiment of the present invention may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-t-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the composition.

<<Silane Coupling Agent>>

The composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more silane coupling agents are used in combination, it is preferable that the total content of the two or more silane coupling agents is in the above-described range.

<<Surfactant>>

The composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the composition according to the embodiment of the present invention containing a fluorine surfactant, liquid characteristics (for example, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine-containing vinyl ether compound having a fluorinated alkyl group or a fluorinated alkylene ether group and a hydrophilic vinyl ether compound is also preferable. The details of this fluorine surfactant can be found in JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

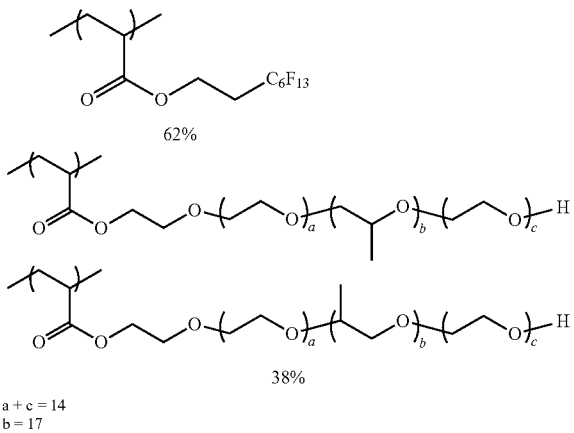

The weight-average molecular weight of the compound is preferably 3000 to 50000 and, for example, 14000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

The content of the surfactant is preferably 0.001 mass % to 5.0 mass % and more preferably 0.005 to 3.0 mass % with respect to the total solid content of the composition according to the embodiment of the present invention. As the surfactant, one kind may be used alone, or two or more kinds may be used. In a case where two or more surfactants are used in combination, it is preferable that the total content of the two or more surfactants is in the above-described range.

<<Ultraviolet Absorber>>

The composition according to the embodiment of the present invention can include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil&Fat Co., Ltd.; The Chemical Daily, Feb. 1, 2016) may be used. As the ultraviolet absorber, a compound represented by any one of Formulae (UV-1) to (UV-3) is preferable, a compound represented by any one of Formula (UV-1) or (UV-3) is more preferable, and a compound represented by Formula (UV-1) is still more preferable.

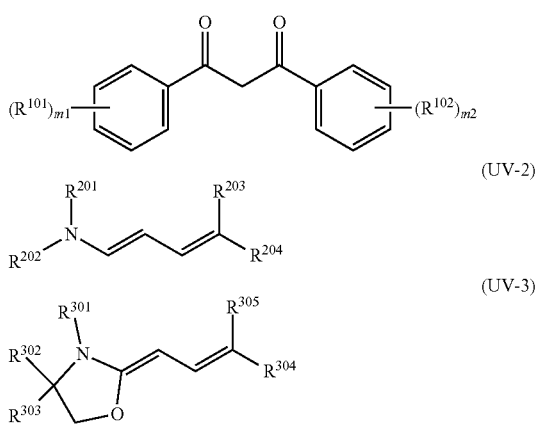

in Formula (UV-1), $R^{101}$ and $R^{102}$ each independently represent a substituent, and m1 and m2 each independently represent 0 to 4. In Formula (UV-2), $R^{201}$ and $R^{202}$ each independently represent a hydrogen atom or an alkyl group, and $R^{203}$ and $R^{204}$ each independently represent a substituent. In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

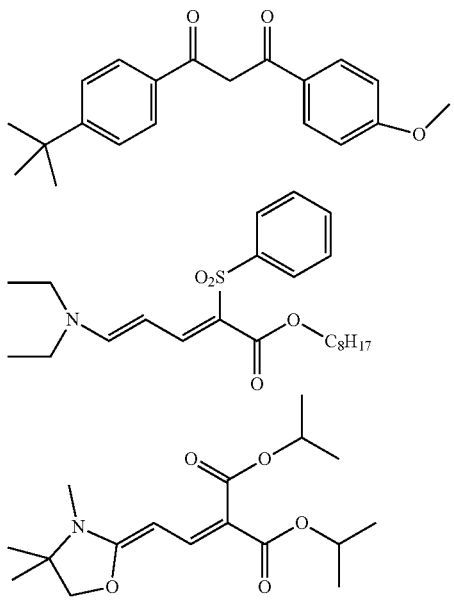

In the composition according to the embodiment of the present invention, the content of the ultraviolet absorber is preferably 0.01 to 10 mass % and more preferably 0.01 to 5 mass % with respect to the total solid content of the composition. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Antioxidant>>

The composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl) dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). In addition, as the antioxidant, a polyfunctional hindered amine antioxidant described in WO17/006600A can also be used.

In the composition according to the embodiment of the present invention, the content of the antioxidant is preferably 0.01 to 20 mass % and more preferably 0.3 to 15 mass % with respect to the total solid content of the composition. As the antioxidant, one kind may be used alone, or two or more kinds may be used in combination. In a case where two or more antioxidants are used in combination, it is preferable that the total content of the two or more antioxidants is in the above-described range.

<<Other Components>>

Optionally, the composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference.

In addition, the composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

For example, in a case where a film is formed by coating, the viscosity (23° C.) of the composition according to the embodiment of the present invention is preferably 1 to 100 mPa·s. The lower limit is preferably 2 mPa·s or higher and more preferably 3 mPa·s or higher. The upper limit is more preferably 50 mPa·s or lower, still more preferably 30 mPa·s or lower, and still more preferably 15 mPa·s or lower.

The concentration of solid contents in the composition according to the embodiment of the present invention is preferably 12 to 28 mass % and more preferably 15 to 25 mass %. In a case where the concentration of solid contents in the composition is in the above-described range, coating properties are excellent.

It is more preferable that the composition according to the embodiment of the present invention satisfies at least one of the following spectral characteristics (1) to (3).

(1) A ratio A1/B1 of a minimum value A1 of an absorbance of the composition in a wavelength range of 400 to 750 nm to a maximum value B1 of an absorbance of the composition in a wavelength range of 900 to 1300 nm is 5 or higher, preferably 7.5 or higher, more preferably 15 or higher, and still more preferably 30 or higher. According to this aspect, a film that can shield light in a wavelength range of 400 to 750 nm and allows transmission of infrared light having a wavelength of longer than 850 nm can be formed.

(2) A ratio A2/B2 of a minimum value A2 of an absorbance of the composition in a wavelength range of 400 to 830 nm to a maximum value B2 of an absorbance of the composition in a wavelength range of 1000 to 1300 nm is 5 or higher, preferably 7.5 or higher, more preferably 15 or higher, and still more preferably 30 or higher. According to this aspect, a film that can shield light in a wavelength range of 400 to 830 nm and allows transmission of infrared light having a wavelength of longer than 940 nm can be formed.

(3) A ratio A3/B3 of a minimum value A3 of an absorbance of the composition in a wavelength range of 400 to 950 nm to a maximum value B3 of an absorbance of the composition in a wavelength range of 1100 to 1300 nm is 5 or higher, preferably 7.5 or higher, more preferably 15 or higher, and still more preferably 30 or higher. According to this aspect, a film that can shield light in a wavelength range of 400 to 950 nm and allows transmission of infrared light having a wavelength of longer than 1040 nm can be formed.

In a case where a film having a thickness of 1 µm, 2 µm, 4 µm, or 5 µm after drying is formed using the composition according to the embodiment of the present invention, it is preferable that spectral characteristics are satisfied in which in which a maximum value of a light transmittance of the film in a thickness direction in a wavelength range of 400 to 750 nm is 20% or lower and a minimum value of a light transmittance of the film in the thickness direction in a wavelength range of 1100 to 1300 nm is 70% or higher. The maximum value in a wavelength range of 400 to 750 nm is more preferably 15% or lower and still more preferably 10% or lower. The minimum value in a wavelength range of 1100 to 1300 nm is more preferably 75% or higher and still more preferably 80% or higher.

In addition, it is more preferable that the composition according to the embodiment of the present invention satisfies at least one of the following spectral characteristics (1) to (3).

(1) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 750 nm is 20% or lower (preferably 15% or lower and more preferably 10% or lower), and a minimum value of a light transmittance of the film in the thickness direction in a wavelength range of 900 to 1300 nm is 70% or higher (preferably 75% or higher and more preferably 80% or higher).

(2) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 830 nm is 20% or lower (preferably 15% or lower and more preferably 10% or lower), and a minimum value of a light transmittance of the film in the thickness direction in a wavelength range of 1000 to 1300 nm is 70% or higher (preferably 75% or higher and more preferably 80% or higher).

(3) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 950 nm is 20% or lower (preferably 15% or lower and more preferably 10% or lower), and a minimum value of a light transmittance of the film in the thickness direction in a wavelength range of 1100 to 1300 nm is 70% or higher (preferably 75% or higher and more preferably 80% or higher).

A storage container of the composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner, wall having a seven-layer structure is formed of six kinds of resins is preferably used. Examples of the container include a container described in JP2015-123351A.

The use of the composition according to the embodiment of the present invention is not particularly limited. The composition according to the embodiment of the present invention can be preferably used to form an infrared transmitting filter or the like.

<Method of Preparing Composition>

The composition according to the embodiment of the present invention can be prepared by mixing the above-described components with each other. During the preparation of the composition, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

In addition, in a case where the composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtering using the first filter may be performed only on the dispersion, and the filtering using the second filter may be performed on a mixture of the dispersion and other components.

<Film>

Next, a film according to the embodiment of the present invention will be described. The film according to the embodiment of the present invention is obtained from the above-described composition according to the embodiment of the present invention. The film according to the embodiment of the present invention can be preferably used as an infrared transmitting filter.

It is preferable that the film according to the embodiment of the present invention satisfies spectral characteristics in which a maximum value of a light transmittance of the film in a thickness direction in a wavelength range of 400 to 750 nm is 20% or lower and in which a minimum value of a light transmittance of the film in the thickness direction in a wavelength range of 1100 to 1300 nm is 70% or higher. The maximum value in a wavelength range of 400 to 750 nm is more preferably 15% or lower and still more preferably 10% or lower. The minimum value in a wavelength range of 1100 to 1300 nm is more preferably 75% or higher and still more preferably 80% or higher.

It is more preferable that the film according to the embodiment of the present invention satisfies at least one of the following spectral characteristics (1) to (3).

(1): an aspect in which a maximum value of a light transmittance of the film in a thickness direction in a wavelength range of 400 to 750 nm is 20% or lower (preferably 15% or lower and more preferably 10% or lower), and a minimum value of a light transmittance of the film in the thickness direction in a wavelength range of 900 to 1300 nm is 70% or higher (preferably 75% or higher and more preferably 80% or higher). According to this aspect, a film that can shield light in a wavelength range of 400 to 750 nm and allows transmission of infrared light having a wavelength of longer than 850 nm can be formed.

(2): an aspect in which a maximum value of a light transmittance of the film in a thickness direction in a wavelength range of 400 to 830 nm is 20% or lower (preferably 15% or lower and more preferably 10% or lower), and a minimum value of a light transmittance of the film in the thickness direction in a wavelength range of 1000 to 1300 nm is 70% or higher (preferably 75% or higher and more preferably 80% or higher). According to this aspect, a film that can shield light in a wavelength range of 400 to 830 nm and allows transmission of infrared light having a wavelength of longer than 940 nm can be formed.

(3): an aspect in which a maximum value of a light transmittance of the film in a thickness direction in a wavelength range of 400 to 950 nm is 20% or lower (preferably 15% or lower and more preferably 10% or lower), and a minimum value of a light transmittance of the film in the thickness direction in a wavelength range of 1100 to 1300 nm is 70% or higher (preferably 75% or higher and more preferably 80% or higher). According to this aspect, a film that can shield light in a wavelength range of 400 to 950 nm and allows transmission of infrared light having a wavelength of longer than 1040 nm can be formed.

The thickness of the film according to the embodiment of the present invention can be adjusted according to the purpose. The thickness of the film is preferably 100 μm or less, more preferably 15 μm or less, still more preferably 5 μm or less, and still more preferably 1 μm or less. For example, the lower limit of the thickness is preferably 0.1 μm or more, more preferably 0.2 μm or more, and still more preferably 0.3 μm or more.

The film according to the embodiment of the present invention can be used in various devices including a solid image pickup element such as a charge coupled device (CCD) or a complementary metal-oxide semiconductor (CMOS), an infrared sensor, or an image display device.

<Film Forming Method>

Next, a film forming method according to the embodiment of the present invention will be described. The film according to the embodiment of the present invention can be formed through a step of applying the composition according to the embodiment of the present invention.

In the film forming method according to the embodiment of the present invention, it is preferable that the composition is applied to a support. Examples of the support include a substrate formed of a material such as silicon, non-alkali glass, soda glass, PYREX (registered trade name) glass, or quartz glass. For example, an organic film or an inorganic film may be fanned on the substrate. Examples of a material of the organic film include the resin described above regarding the composition. In addition, as the support, a substrate formed of the resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A. In addition, it is preferable that the application using a spin coating method is performed at a rotation speed of 1000 to 2000 rpm. In addition, during the coating using a spin coating method, the rotation speed may be increased as described in JP 1998-142603A (JP-H10-146203A), JP1999-302413A (JP-H11-302413A), or JP2000-157922A. In addition, a spin coating process described in "Process Technique and Chemicals for Latest Color Filter"(Jan. 31, 2006, CMC Publishing Co., Ltd.) can also be suitably used.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 3000 seconds, more preferably 40 to 2500 seconds, and still more preferably 80 to 220 seconds. Drying can be performed using a hot plate, an oven, or the like.

It is preferable that the film forming method according to the embodiment of the present invention may further include a step of forming a pattern. As the pattern forming method, a pattern forming method using a photolithography method is preferable. It is preferable that the pattern forming method using a photolithography method includes: a step (exposure step) of exposing the composition layer, which is formed by applying the composition according to the embodiment of the present invention, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, in particular, ultraviolet rays such as g-rays or i-rays are preferable, and i-rays are more preferable. The irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photo-cured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutyl ammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, the developer may include a surfactant to be used. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), or a high-frequency heater under the above-described conditions. In addition, in a case where a pattern is formed through a low-temperature process, post-baking is not necessarily performed.

<Infrared Transmitting Filter>

Next, an infrared transmitting filter according to the embodiment of the present invention will be described. The infrared transmitting filter according to the embodiment of the present invention includes the film according to the embodiment of the present invention.

The infrared transmitting filter according to the embodiment of the present invention can be used in combination with a color filter that includes a chromatic colorant. The color filter can be manufactured using a coloring composition including a chromatic colorant. Examples of the chromatic colorant include the chromatic colorants described regarding the composition according to the embodiment of the present invention. The coloring composition may further include, for example, a resin, a polymerizable compound, a photopolymerization initiator, a surfactant, a solvent, a polymerization inhibitor, and an ultraviolet absorber. In more detail, for example, the materials described above regarding the composition according to the embodiment of the present invention can be used.

In addition, it is also preferable that the infrared transmitting filter according to the embodiment of the present invention includes a pixel of the film according to the embodiment of the present invention and a pixel selected from the group consisting of a red pixel, a green pixel, a blue pixel, a magenta pixel, a yellow pixel, a cyan pixel, a black pixel, and an achromatic pixel.

<Solid Image Pickup Element>

A solid image pickup element according to the embodiment of the present invention includes the film according to the embodiment of the present invention. The configuration of the solid image pickup element is not particularly limited as long as it includes the film according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present invention is formed on the device protective film. Further, a configuration in which light collecting means (for example, a microlens; hereinafter, the same shall be applied) is provided above the device protective film and below the film according to the embodiment of the present invention (on a side thereof close the support), or a configuration in which light collecting means is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hu side of the color filters 112 and the infrared transmitting filters 114. A planarizing layer 116 is formed so as to cover the microlenses 115.

Spectral characteristics of the near infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the infrared transmitting filters 114 can be selected according to the emission wavelength of the infrared LED to be used.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multi-layer film may be provided. The details of the groups are as described above. In addition, as the other near infrared cut filter, a dual band pass filter may be used.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

Test Example 1

<Preparation of Dispersion>

Raw materials shown in the following table were mixed with each other, 230 parts by mass of zirconia beads having a diameter of 0.3 mm were further added to the mixture, and the solution was dispersed using a paint shaker for 5 hours. Next, the beads were separated by filtration. As a result, a dispersion was manufactured. Numerical values in the following table are represented by "part(s) by mass".

TABLE 1

| | Colorant, Near Infrared Absorber | | Dispersing Auxiliary Agent (Pigment Derivative, Resin) | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Pigment Dispersion R-1 | PR254 | 12.00 | | | C1 | 4.2 | J1 | 83.80 |
| Pigment Dispersion R-2 | PR254 | 8.3 | B1 | 2.3 | C2 | 4.4 | J1 | 81.30 |
| | PY139 | 3.7 | | | | | | |
| Pigment Dispersion Y-1 | PY139 | 11.00 | B1 | 1.59 | C2 | 4.4 | J1 | 83.01 |
| Pigment Dispersion Y-2 | PY150 | 11.00 | B1 | 1.59 | C2 | 4.4 | J1 | 83.01 |
| Pigment Dispersion Y-3 | Metal Azo Pigment A1 | 11.00 | B1 | 1.59 | C2 | 4.4 | J1 | 83.01 |
| Pigment Dispersion V-1 | PV23 | 14.20 | P1 | 2 | C2 | 3.8 | J1 | 70.00 |
| | | | | | | | J2 | 10.00 |
| Pigment Dispersion B-1 | PB15:6 | 12.59 | | | C2 | 4.4 | J1 | 83.01 |
| Pigment Dispersion B-2 | PB15:6 | 10.00 | | | C2 | 4.4 | J1 | 83.01 |
| | PV23 | 2.59 | | | | | | |
| Pigment Dispersion Bk-1 | IB | 12.59 | | | C1 | 4.4 | J1 | 83.01 |
| Pigment Dispersion Bk-2 | PBk32 | 12.59 | | | C2 | 4.4 | J1 | 83.01 |
| Pigment Dispersion Bk-3 | PR254 | 6.92 | | | C3 | 8.1 | J1 | 73.9 |
| | PY139 | 4.02 | | | | | | |
| | PB15:6 | 7.06 | | | | | | |
| Pigment Dispersion IR-1 | K1 | 11.00 | B1 | 1.59 | C2 | 6 | J1 | 81.41 |
| Pigment Dispersion IR-2 | K2 | 6.70 | K3 | 0.8 | C3 | 6.0 | J1 | 86.50 |
| Pigment Dispersion IR-3 | K2 | 6.70 | K4 | 0.8 | C3 | 6.0 | J1 | 86.50 |

<Preparation of Composition>

Raw materials shown in the following tables were mixed with each other to prepare a composition (curable composition). Numerical values in the following table are represented by "part(s) by mass".

TABLE 2

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Pigment Dispersion | R-1 | | | | | | | | | 25.69 | |
| | R-2 | 17.16 | 17.16 | 18.49 | 16.81 | | | | | | 32.73 |
| | Y-1 | 13.14 | 13.14 | 14.28 | | 16.95 | 16.95 | 7.82 | | 14.23 | |
| | Y-2 | | | | 12.96 | | | | | | |
| | V-1 | 7.68 | 7.68 | | | | | | | | |
| | B-1 | 38.27 | 38.27 | 48.72 | | 16.95 | 16.95 | | | 24.99 | |
| | R-2 | | | | 44.29 | | | 20.34 | | | 33.46 |
| | Bk-1 | | | | | | | | 54.77 | | |
| | Bk-2 | | | | | 52.16 | 52.16 | | | | |
| | Bk-3 | | | | | | | | 49.01 | | |
| | IR-1 | | | | | | | | | | 16.73 |
| | IR-2 | | | | | | | | | 23.73 | |
| | IR-3 | | | | | | | | 26.11 | | |

TABLE 2-continued

| | | | | | | | | | | | |
|---|---|---|---|---|---|---|---|---|---|---|---|
| Polymerizable Compound | D1 | 0.80 | 0.80 | 0.92 | 2.54 | 1.89 | 1.89 | | 1.17 | 1.13 | |
| | D2 | 1.00 | 1.00 | 0.26 | | | | | 1.17 | 0.72 | 2.81 |
| | D3 | 0.80 | 0.80 | 0.20 | | | | | 0.53 | | |
| | D4 | | | | | | | 1.98 | | | |
| | D5 | | | 0.92 | | | | | | | |
| | D6 | | | | | | | | | 0.76 | |
| | D7 | | | | | | | | | | |
| | D8 | | | | | | | | | | |
| | D9 | | | | | | | | | | |
| Photopolymerization Initiator | I1 | | | | | | | | 0.261 | | |
| | I2 | | | 0.793 | | | | 0.344 | 0.910 | | |
| | I3 | 0.540 | 0.540 | | | 0.655 | | | | 1.065 | 1.148 |
| | I4 | 0.400 | 0.400 | | 0.876 | | | 0.340 | | | |
| | I5 | | | | | | 0.655 | | | | |
| Resin | P1 | 2.99 | | 2.45 | 3.41 | 2.53 | 2.53 | 2.95 | 1.64 | 2.3 | 3.12 |
| | P2 | | 2.99 | | | | | | | | |
| Surfactant | F1 | 0.04 | 0.04 | 0.04 | 0.04 | 0.04 | 0.04 | 0.04 | 0.05 | 0.05 | 0.05 |
| Polymerization Inhibitor | G1 | 0.0013 | 0.0013 | 0.0011 | 0.0013 | 0.0009 | 0.0009 | 0.001 | 0.0014 | 0.0013 | 0.0014 |
| Solvent | J1 | 17.22 | 17.22 | 12.98 | 19.10 | 8.86 | 8.86 | 10.23 | 19.20 | 5.39 | 9.99 |
| | J3 | | | | | | | | | | |
| | J4 | | | | | | | 1.23 | | | |

| | | Example 11 | Example 12 | Comparative Example 1 | Comparative Example 2 | Comparative Example 3 | Comparative Example 4 | Comparative Example 5 |
|---|---|---|---|---|---|---|---|---|
| Pigment Dispersion | R-1 | 20.45 | | | | | | |
| | R-2 | | 19.97 | | | 32.73 | | |
| | Y-1 | 13.14 | 21.17 | 16.95 | 7.82 | | 7.82 | 16.95 |
| | Y-2 | | | | | | | |
| | V-1 | 7.68 | 7.87 | | | | | |
| | B-1 | 38.27 | | 16.95 | | | | |
| | R-2 | | 39.21 | | 20.34 | 33.46 | 20.34 | |
| | Bk-1 | | | | 54.77 | | 54.77 | |
| | Bk-2 | | | 52.16 | | | | 52.16 |
| | Bk-3 | | | | | | | |
| | IR-1 | | | | | 16.73 | | |
| | IR-2 | | | | | | | |
| | IR-3 | | | | | | | |
| Polymerizable Compound | D1 | 2.60 | 1.00 | | | | | |
| | D2 | | 1.10 | | | | | |
| | D3 | | | | | | | |
| | D4 | | | | | | | |
| | D5 | | 0.23 | 1.89 | | | | |
| | D6 | | | | | 2.81 | | |
| | D7 | | | | 1.98 | | | |
| | D8 | | | | | | 1.98 | |
| | D9 | | | | | | | 1.89 |
| Photopolymerization Initiator | I1 | 0.940 | | | | | | |
| | I2 | | 0.805 | | 0.684 | | 0.684 | |
| | I3 | | | 0.655 | | 1.148 | | 0.655 |
| | I4 | | | | | | | |
| | I5 | | | | | | | |
| Resin | P1 | 2.88 | 2.14 | 2.53 | 2.95 | 3.12 | 2.95 | 2.53 |
| | P2 | | | | | | | |
| Surfactant | F1 | 0.04 | 0.04 | 0.04 | 0.04 | 0.05 | 0.04 | 0.04 |
| Polymerization Inhibitor | G1 | 0.0013 | 0.0012 | 0.0009 | 0.001 | 0.0014 | 0.001 | 0.0009 |
| Solvent | J1 | 12.02 | 6.50 | 8.86 | 10.23 | 9.99 | 10.23 | 8.86 |
| | J3 | 2.02 | | | | | | |
| | J4 | | | | | | | |

TABLE 3

| | | Example 13 | Example 14 | Example 15 | Example 16 | Example 17 | Example 18 | Example 19 | Example 20 | Example 21 | Example 22 | Example 23 |
|---|---|---|---|---|---|---|---|---|---|---|---|---|
| Pigment Dispersion | R-1 | | | | | | | | | | 25.69 | |
| | R-2 | 17.16 | 17.16 | 18.49 | 16.81 | 16.81 | | | | | | 32.73 |
| | Y-1 | 13.14 | 13.14 | 14.28 | | | 16.95 | 7.82 | 7.82 | | 14.23 | |
| | Y-2 | | | | 12.96 | | | | | | | |
| | Y-3 | | | | | 12.96 | | | | | | |
| | V-1 | 7.68 | 7.68 | | | | | | | | | |
| | B-1 | 38.27 | 38.27 | 48.72 | | | 16.95 | | | | 24.99 | |
| | B-2 | | | | 44.29 | 44.29 | | 20.34 | 20.34 | | | 33.46 |

TABLE 3-continued

|  |  | Example 13 | Example 14 | Example 15 | Example 16 | Example 17 | Example 18 | Example 19 | Example 20 | Example 21 | Example 22 | Example 23 |
|---|---|---|---|---|---|---|---|---|---|---|---|---|
|  | Bk-1 |  |  |  |  |  |  | 54.77 | 54.77 |  |  |  |
|  | Bk-2 |  |  |  |  |  | 52.16 |  |  |  |  |  |
|  | Bk-3 |  |  |  |  |  |  |  |  |  | 49.01 |  |
|  | IR-1 |  |  |  |  |  |  |  |  |  |  | 16.73 |
|  | IR-2 |  |  |  |  |  |  |  |  |  | 23.73 |  |
|  | IR-3 |  |  |  |  |  |  |  |  | 26.11 |  |  |
| Polymerizable Compound | D1 | 0.80 | 0.80 | 0.92 | 0.80 | 0.80 | 1.89 | 1.50 | 1.28 | 1.17 | 1.13 |  |
|  | D2 | 1.00 | 1.00 | 0.26 | 1.00 | 1.00 |  | 1.46 |  | 1.17 | 0.72 | 2.81 |
|  | D3 | 0.80 | 0.80 | 0.20 | 0.80 | 0.80 |  | 0.20 |  | 0.53 |  |  |
|  | D4 |  |  |  |  |  |  |  | 1.78 |  |  |  |
|  | D5 |  |  | 0.92 |  |  |  |  |  |  |  |  |
|  | D6 |  |  |  |  |  |  |  |  |  | 0.76 |  |
| Photopolymerization Initiator | I1 |  |  |  |  |  |  |  |  | 0.261 |  |  |
|  | I2 |  |  |  |  |  |  |  |  |  |  |  |
|  | I3 |  |  |  |  |  |  |  |  |  | 0.565 | 0.748 |
|  | I4 | 0.400 | 0.400 |  |  |  |  | 0.340 | 0.340 |  |  |  |
|  | I5 |  |  |  |  |  |  |  |  |  |  |  |
|  | I6 | 0.540 |  |  |  |  |  |  |  |  |  |  |
|  | I7 |  | 0.540 |  |  |  |  |  |  |  | 0.500 |  |
|  | I8 |  |  | 0.793 |  |  |  |  |  |  |  |  |
|  | I9 |  |  |  | 0.876 | 0.876 |  |  |  |  |  |  |
|  | I10 |  |  |  |  |  | 0.655 |  |  |  |  |  |
|  | I11 |  |  |  |  |  |  | 0.350 |  |  |  | 0.400 |
|  | I12 |  |  |  |  |  |  |  | 0.350 |  |  |  |
|  | I13 |  |  |  |  |  |  |  |  | 0.910 |  |  |
| Resin | P1 |  |  | 2.45 | 3.41 | 3.41 | 2.53 | 2.95 | 2.95 | 1.64 | 2.3 | 3.12 |
|  | P2 | 2.99 | 2.99 |  |  |  |  |  |  |  |  |  |
| Surfactant | P1 | 0.04 | 0.04 | 0.04 | 0.04 | 0.04 | 0.04 | 004 | 0.04 | 0.05 | 0.05 | 0.05 |
| Polymerization Inhibitor | G1 | 0.0013 | 0.0013 | 0.0011 | 0.0013 | 0.0013 | 0.0009 | 0.001 | 0.001 | 0.0014 | 0.0013 | 0.0014 |
| Solvent | J1 | 17.22 | 17.22 | 12.98 | 19.10 | 19.10 | 8.86 | 10.23 | 10.23 | 19.20 | 5.39 | 9.99 |

The raw materials shown above in the table are as follows.

(Near Infrared Absorber)

K1, K2: compounds having the following structures. In the following structural formulae, Me represents a methyl group, and Ph represents a phenyl group.

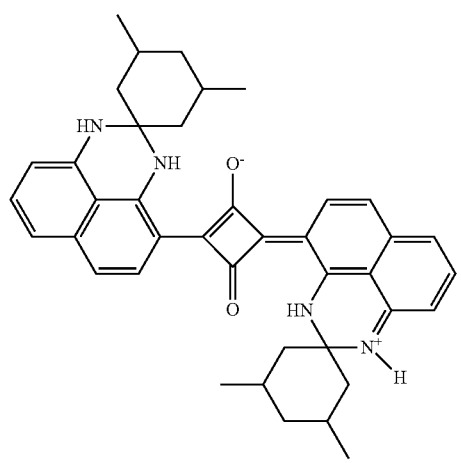

(K1)

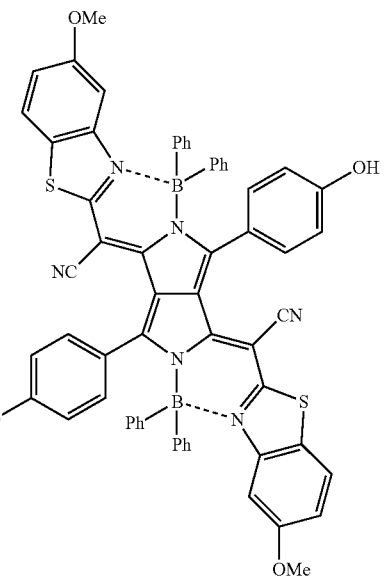

(K2)

(Colorant)

PR254: C.I. Pigment Red 254
PY139: C.I. Pigment Yellow 139
PY150: C.I. Pigment Yellow 150
PB 15:6: C.I. Pigment Blue 15:6
PV23: C.I. Pigment Violet 23
PBk 32: C.I. Pigment Black 32
IB: IRGAPHOR BLACK (manufactured by BASF SE, a compound having the following structure)

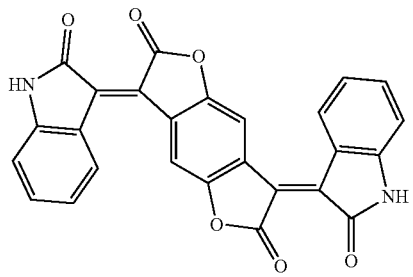 [SMILES: O=C1Nc2ccccc2/C1=C1/C(=O)Oc2cc3c(cc21)OC(=O)/C3=C1\C(=O)Nc2ccccc21]

Metal azo pigment A1: a metal azo pigment A1 prepared using the following method 46.2 g of diazobarbituric acid and 38.4 g of barbituric acid were added to 1100 g of distilled water at 85° C. Next, a potassium hydroxide aqueous solution was added to this solution such that the pH is adjusted to about 5, and the solution was stirred for 90 minutes to manufacture an azobarbituric acid precursor. Next, 1500 g of distilled water at 82° C. was added to the azobarbituric acid precursor manufactured using the above-described method. Next, 10g of 30% hydrochloric acid was added dropwise. Next, 79.4 g of melamine was added. Next, a mixture of 0.282 mol of about 25% zinc chloride solution and 0.0015 mol of about 30% copper (II) chloride solution was added dropwise. Next, the solution to which the components were added was held at a temperature of 82° C. for 3 hours, and then KOH was added thereto such that the pH was adjusted to about 5.5. Next, while increasing the temperature of the solution to 90° C. and maintaining the temperature at 90° C., 100 g of distilled water was added for dilution. Next, 21 g of 30% hydrochloric acid was added dropwise to the solution and was heated at a temperature of 90° C. for 12 hours. Next, a potassium hydroxide aqueous solution was added to the heated solution such that the pH was adjusted to about 5. Next, the pigment was isolated from the solution to a suction filter, was cleaned, was dried in a vacuum drying cabinet at 80° C., and was pulverized in a standard laboratory mill for about 2 minutes. As a result, a metal azo pigment A1 was manufactured.

(Pigment Derivative)

B1, K3, K4: compounds having the following structures. In the following structural formulae, Ph represents a phenyl group, and Me represents a methyl group.

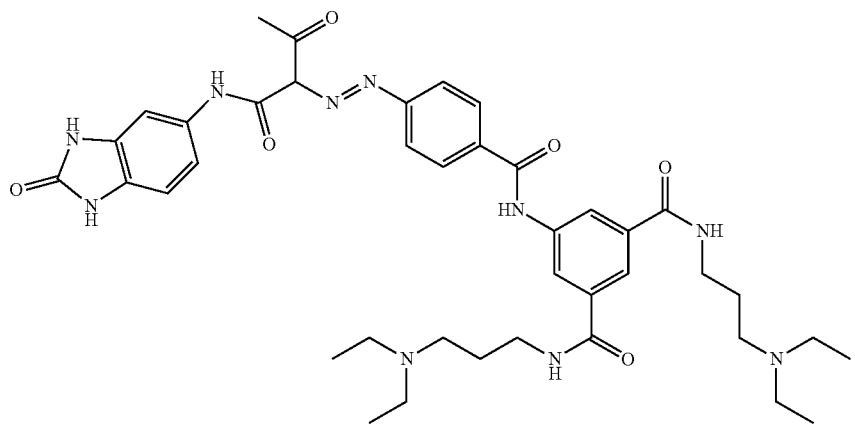

(B1)

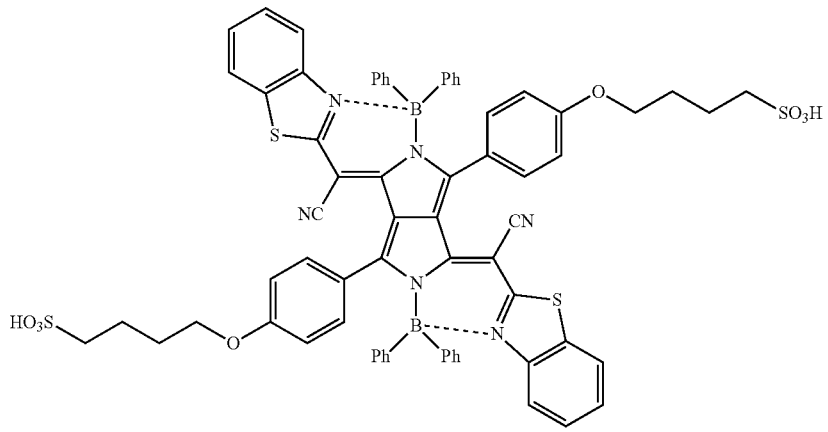

(K3)

(K4)

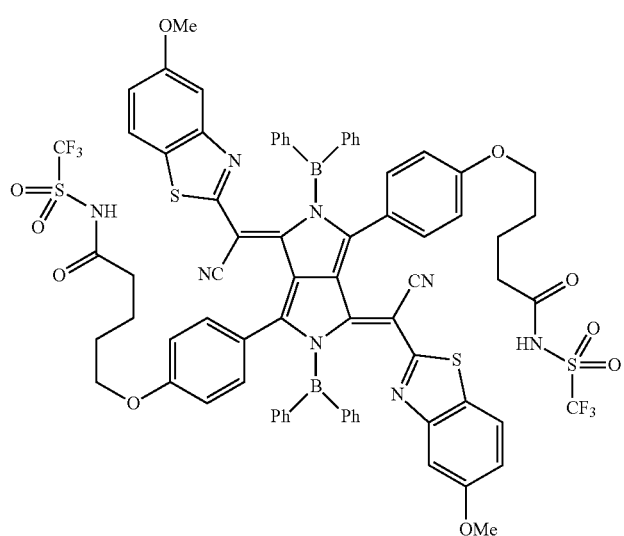

(Dispersant)

C1: a resin having the following structure (a numerical value added to a main chain represents a molar ratio, and a numerical value added to a side chain represents the number of repeating units; Mw=20,000)

C2: a resin having the following structure (a numerical value added to a main chain represents a molar ratio, and a numerical value added to a side chain represents the number of repeating units; Mw=24,000)

C3: a resin having the following structure (a numerical value added to a main chain represents a molar ratio, and a numerical value added to a side chain represents the number of repeating units; Mw=20,000)

(C1)

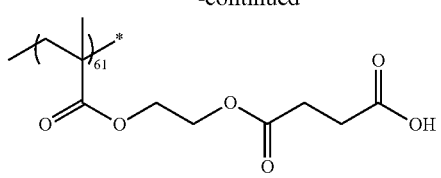

(C2)

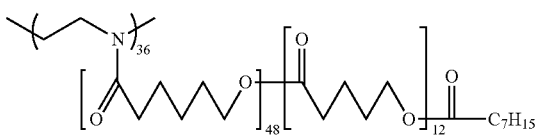

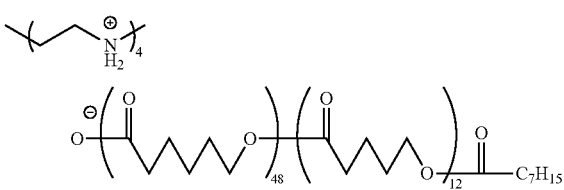

(C3)

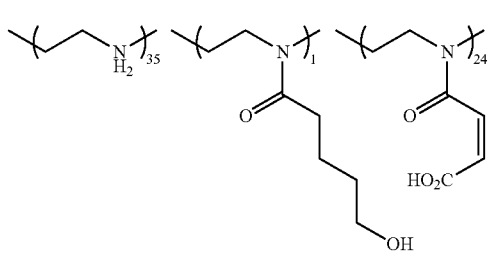

(Resin)

P1: a resin having the following structure (Mw=11,000; a numerical value added to a main chain represents a molar ratio)

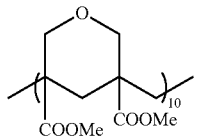
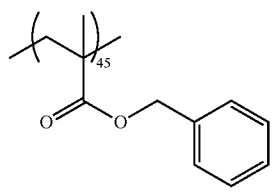
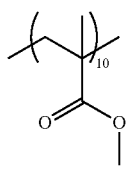
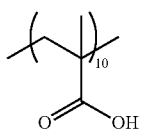

(P1)

P2: a resin having the following structure (Mw=4400, acid value=95 mgKOH/g; in the following structural formula, M represents a phenyl group, and A represents biphenyltetracarboxylic anhydride residue)

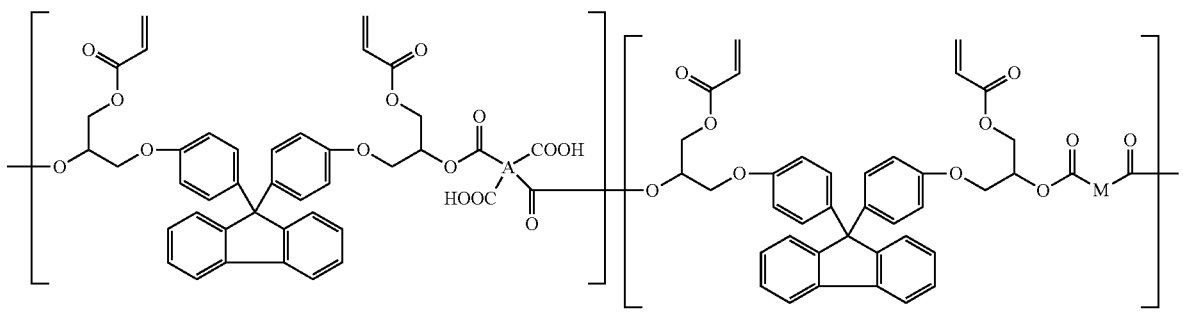

(Polymerizable Compound)

D1: a compound having the following structure (a+b+c=3)

D2: a compound having the following structure (a+b+c=4)

D3: a mixture of compounds having the following structures (compound in which a+b+c=5:compound in which a+b+c=6=3:1 (molar ratio))

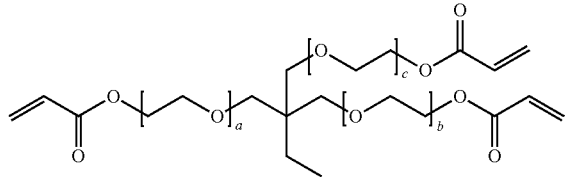

D4: a compound having the following structure

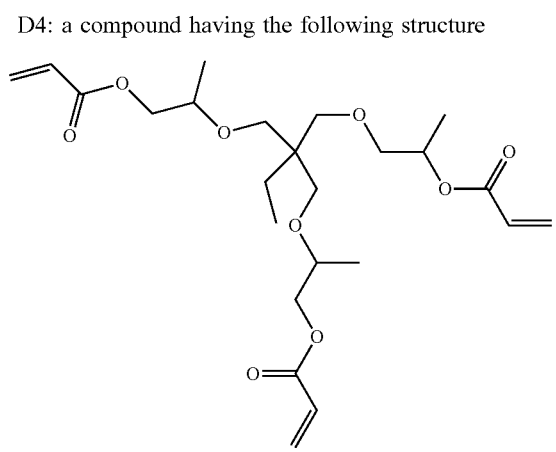

D5: a compound having the following structure

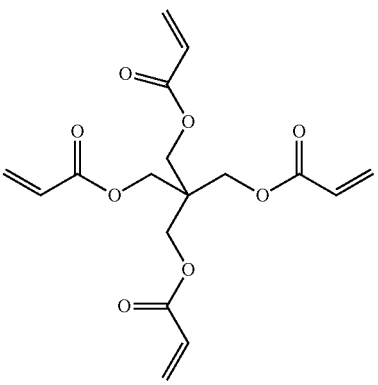 [SMILES: C=CC(=O)OCC(COC(=O)C=C)(COC(=O)C=C)COC(=O)C=C]

D6: a compound having the following structures (a mixture in which a molar ratio between a left compound and a right compound is 7:3)

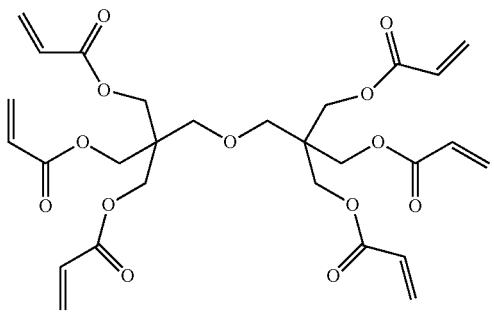

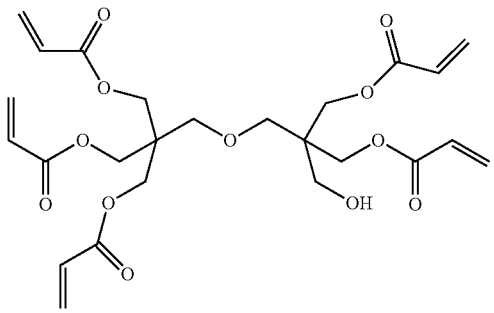

D7: a compound having the following structure

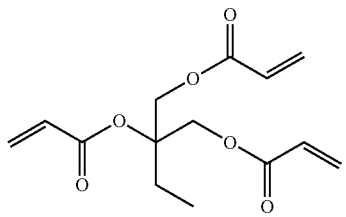 [SMILES: C=CC(=O)OCC(CC)(COC(=O)C=C)OC(=O)C=C]

D8: a compound having the following structure

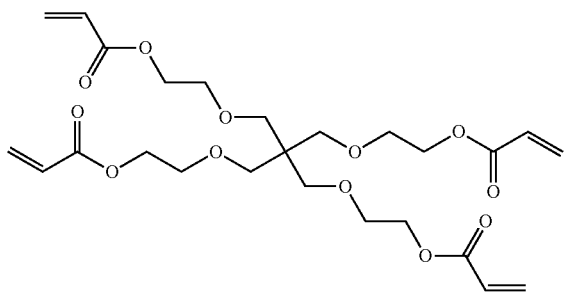 [SMILES: C=CC(=O)OCCOCC(COCCOC(=O)C=C)(COCCOC(=O)C=C)COCCOC(=O)C=C]

D9: a compound having the following structure

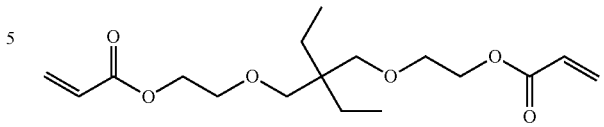

(Photopolymerization Initiator)

I1: a compound having the following structure (molar absorption coefficient at a wavelength of 365 nm=4800 L·mol$^{-1}$·cm$^{-1}$)

I2: a compound having the following structure (molar absorption coefficient at a wavelength of 365 nm=18900 L·mol$^{-1}$·cm$^{-1}$)

I3: a compound having the following structure (molar absorption coefficient at a wavelength of 365 nm=5000 L·mol$^{-1}$·cm$^{1}$ or higher)

I4: a compound having the following structure (molar absorption coefficient at a wavelength of 365 nm=3000 L·mol$^{-1}$·cm$^{-1}$)

I5: a compound having the following structure (molar absorption coefficient at a wavelength of 365 nm=5000 L·mol$^{-1}$·cm$^{-1}$ or higher)

I6: a compound No. 12 described in paragraph "0007" of JP2017-523465A (molar absorption coefficient at a wavelength of 365 nm=5000 L·mol$^{-1}$·cm$^{-1}$ or higher)

I7: a compound No. 14 described in paragraph "0007" of JP2017-523465A (molar absorption coefficient at a wavelength of 365 nm=5000 L·mol$^{-1}$·cm$^{-1}$ or higher)

I8: a compound No. 24 described in paragraph "0007" of JP2017-523465A (molar absorption coefficient at a wavelength of 365 nm=5000 L·mol$^{-1}$·cm$^{-1}$ or higher)

I9: a compound No. 31 described in paragraph "0007" of JP2017-523465A (molar absorption coefficient at a wavelength of 365 nm=5000 L·mol$^{-1}$·cm$^{-1}$ or higher)

I10: a compound No. 49 described in paragraph "0007" of JP2017-523465A (molar absorption coefficient at a wavelength of 365 nm=5000 L·mol$^{-1}$·cm$^{-1}$ or higher)

I11: a compound of Formula (2) described in paragraph "0025" of JP2017-151342A (molar absorption coefficient at a wavelength of 365 nm=5000 L·mol$^{-1}$·cm$^{-1}$ or higher)

I12: a compound 6 described in paragraph "0030" of JP2017-167399A (molar absorption coefficient at a wavelength of 365 nm=5000 L·mol$^{-1}$·cm$^{-1}$ or higher)

I13: a compound described in Formula (I) of Chem. 65 of paragraph "0407" of JP2016-532675A (molar absorption coefficient at a wavelength of 365 nm=5000 L·mol$^{-1}$·cm$^{-1}$ or higher)

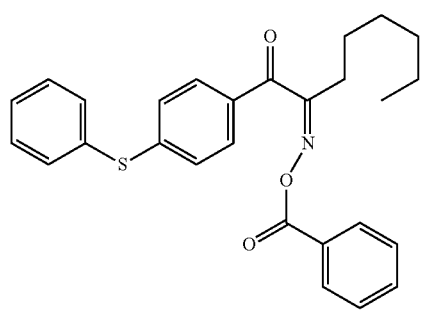
(I1)
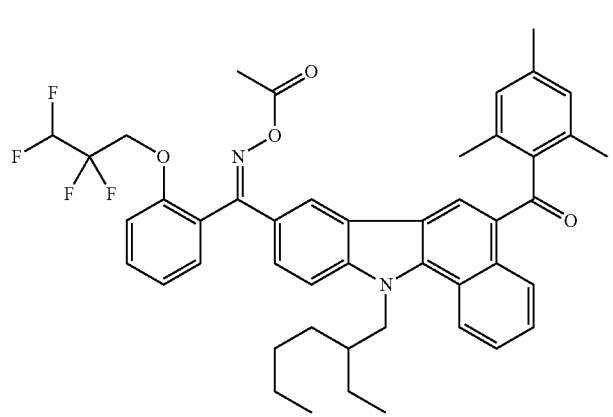
(I2)
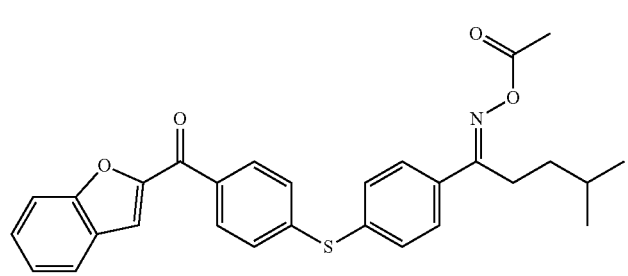
(I3)
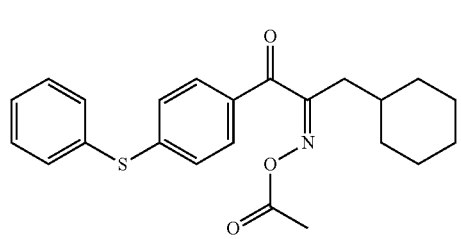
(I4)
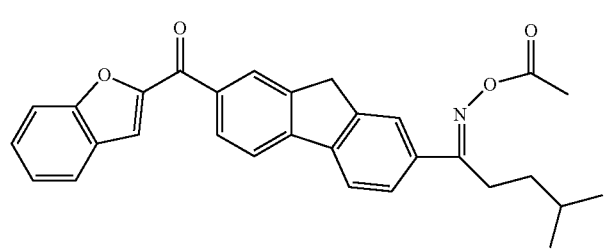
(I5)

(I6)
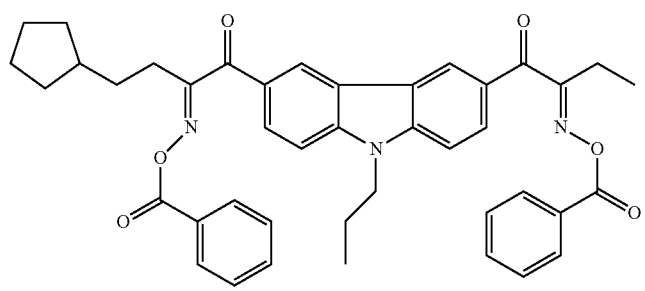
(I7)
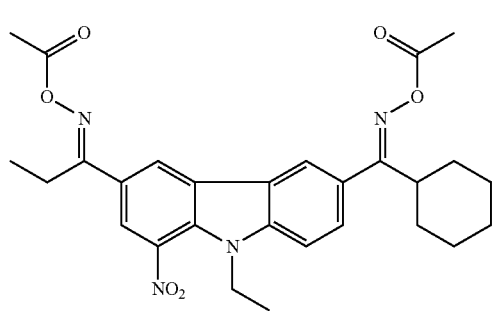
(I8)
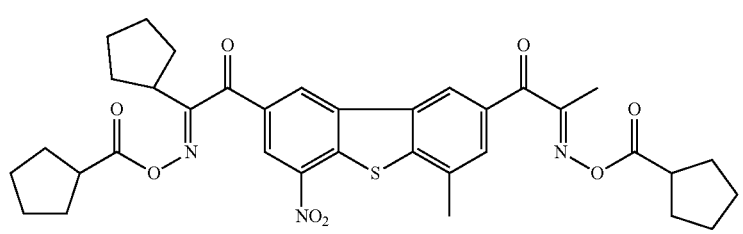
(I9)
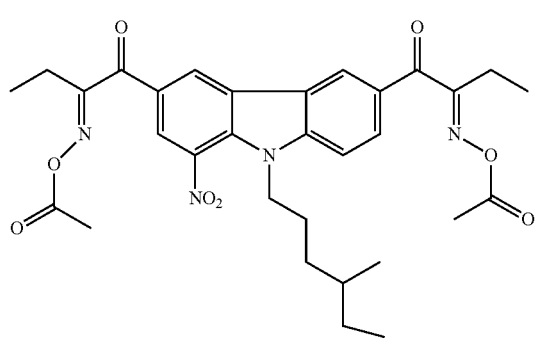
(I10)
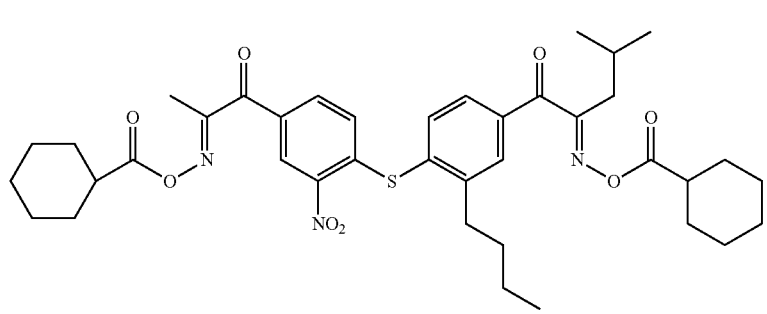

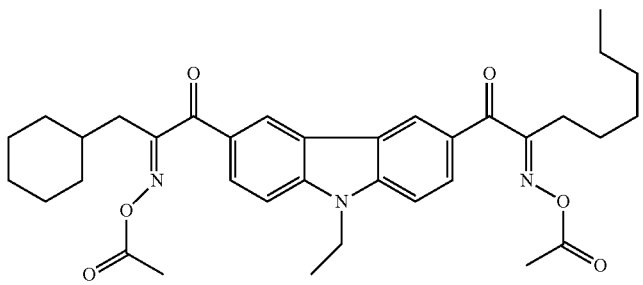

(I11)

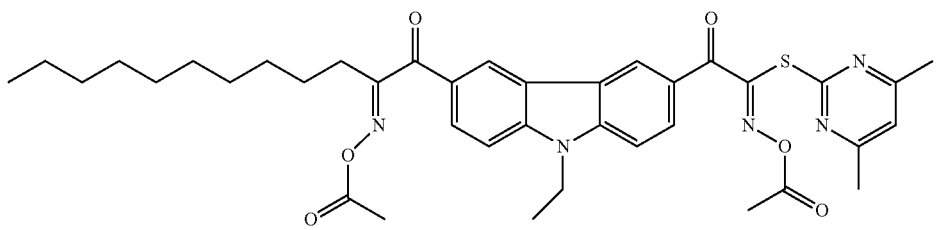

(I12)

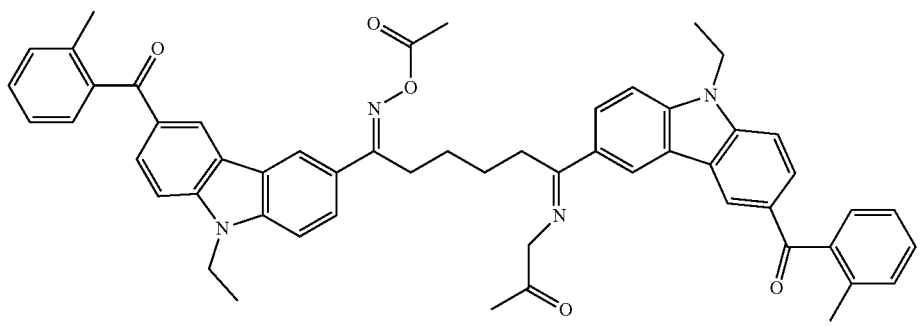

(I13)

(Surfactant)

F1: the following mixture (Mw=14000, in the following formula, "%" representing the proportion of a repeating unit is mol %)

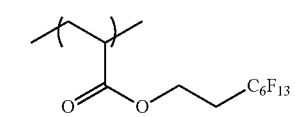

62%

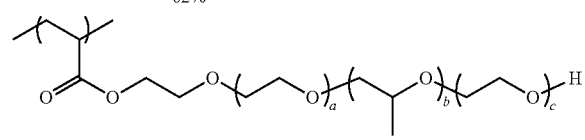

38% a + c = 14
b = 17

(Polymerization Inhibitor)
G1: p-methoxyphenol
(Solvent)
J1: propylene glycol monomethyl ether acetate (PGMEA)
J2: cyclohexanone
J3: 3-methoxy-N,N-dimethylpropanamide
J4: 3-butoxy-N,N-dimethylpropanamide <Absorbance and Spectral Characteristics>

Specifically, each of the compositions was applied to a glass substrate using a spin coating method such that the thickness after post-baking was as shown in the following table, was dried using a hot plate at 100° C. for 120 seconds, and then was further heated (post-baked) using a hot plate at 200° C. for 300 seconds. As a result, a film was formed. In the glass substrate on which the film was formed, a minimum value A of the absorbance in a wavelength range of 400 to 750 nm and a maximum value B of the absorbance in a wavelength range of 1100 to 1300 nm were measured using an ultraviolet-visible-near infrared spectrophotometer U-4100 (manufactured by Hitachi High-Technologies Corporation).

<Evaluation of Adhesiveness>

CT-4000L (manufactured by Fujifilm Electronic Materials Co., Ltd.) was uniformly applied to an 8-inch (20.32 cm) silicon wafer by spin coating to form a coating film. The formed coating film was further treated in an oven at 220° C. for 1 hour to cure the coating film. As a result, an undercoat layer was formed. The rotation speed during the spin coating was adjusted such that the thickness of the heated coating film was about 0.1 µm.

Next, each of the compositions obtained as described above was applied to the undercoat layer of the silicon wafer using a spin coater such that the thickness of the film after drying was as shown in the following table, and was dried using a hot plate at 100° C. for 120 seconds.

Next, using an i-ray stepper exposure device FPA-i5+ (manufactured by Canon Corporation), the coating film was exposed to light having a wavelength of 365 nm at an exposure dose of 50 to 1700 mJ/cm² through a 1.0 μm×1.0 μm 1.0 μm×1.0 μm or 1.1 μm×1.1 μm island pattern mask. After the exposure, the exposed film was developed using an alkali developer (CD-2000, manufactured by Fujifilm Electronic Materials Co., Ltd.) at 25° C. for 40 seconds. Next, the developed film was rinsed with flowing water for 30 seconds and was dried by spraying to obtain a pattern.

The obtained pattern was observed using a scanning electron microscope (S-9220, manufactured by Hitachi, Ltd.) from above the pattern to measure the size of the pattern. In addition, adhesiveness was evaluated using an optical microscope based on the following standards.

5: the minimum size of pixels adhered to each other was 90% or lower with respect to the design dimension of the mask 4: the minimum size of pixels adhered to each other was higher than 90% and 99% or lower with respect to the design dimension of the mask 3: the minimum size of pixels adhered to each other was higher than 99% and 105% or lower with respect to the design dimension of the mask 2: the minimum size of pixels adhered to each other was higher than 105% and 110% or lower with respect to the design dimension of the mask 1: a part of the pattern exceeding 110% with respect to the design dimension of the mask was not adhered As shown in the table, with each of the composition according to Examples, a pattern having excellent adhesiveness was able to be formed. In addition, the film formed using each of the compositions according to Examples was incorporated into a solid image pickup element using a well-known method. The obtained solid image pickup element was irradiated with light emitted from an infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

Test Example 2

A composition for forming a near infrared cut filter was applied to a silicon wafer using a spin coating method such that the thickness of the formed film was 1.0 μm. Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm².

Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200°

TABLE 4

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Evaluation | Thickness | 1.1 | 1.1 | 1.0 | 1.1 | 1.1 | 1.1 | 1.1 | 1.5 | 1.5 | 1.5 |
| | Absorbance A | 1.10 | 1.10 | 1.12 | 0.96 | 0.64 | 0.64 | 0.92 | 1.14 | 1.14 | 0.98 |
| | Absorbance B | 0.02 | 0.02 | 0.02 | 0.04 | 0.04 | 0.04 | 0.02 | 0.02 | 0.02 | 0.04 |
| | A/B | 49.2 | 49.2 | 72.7 | 23.4 | 17.6 | 17.6 | 37.5 | 46.5 | 46.5 | 25.3 |
| | Adhesiveness during use of 1.1 μm Mask | 5 | 5 | 5 | 3 | 5 | 5 | 3 | 5 | 5 | 4 |
| | Adhesiveness during use of 1.0 μm Mask | 5 | 5 | 5 | 3 | 4 | 4 | 3 | 5 | 5 | 4 |

| | | Example 11 | Example 12 | Comparative Example 1 | Comparative Example 2 | Comparative Example 3 | Comparative Example 4 | Comparative Example 5 |
|---|---|---|---|---|---|---|---|---|
| Evaluation | Thickness | 1.1 | 1.1 | 1.1 | 1.1 | 1.5 | 1.1 | 1.1 |
| | Absorbance A | 1.10 | 1.30 | 0.64 | 0.92 | 0.98 | 0.92 | 0.64 |
| | Absorbance B | 0.02 | 0.02 | 0.04 | 0.02 | 0.04 | 0.02 | 0.04 |
| | A/B | 49.2 | 73.4 | 17.6 | 37.5 | 25.3 | 37.5 | 17.6 |
| | Adhesiveness during use of 1.1 μm Mask | 3 | 5 | 1 | 1 | 1 | 1 | 1 |
| | Adhesiveness during use of 1.0 μm Mask | 2 | 5 | 1 | 1 | 1 | 1 | 1 |

TABLE 5

| | | Example 13 | Example 14 | Example 15 | Example 16 | Example 17 | Example 18 | Example 19 | Example 20 | Example 21 | Example 22 | Example 23 |
|---|---|---|---|---|---|---|---|---|---|---|---|---|
| Evaluation | Film Thickness | 1.1 | 1.1 | 1.0 | 1.1 | 1.1 | 1.1 | 1.1 | 1.1 | 1.5 | 1.5 | 1.5 |
| | Absorbance A | 1.10 | 1.10 | 1.12 | 0.96 | 0.96 | 0.64 | 0.92 | 0.92 | 1.14 | 1.14 | 0.98 |
| | Absorbance B | 0.02 | 0.02 | 0.02 | 0.04 | 0.04 | 0.04 | 0.02 | 0.02 | 0.02 | 0.02 | 0.04 |
| | A/B | 49.2 | 49.2 | 72.7 | 23.4 | 23.4 | 17.6 | 37.5 | 37.5 | 46.5 | 46.5 | 25.3 |
| | Adhesiveness during use of 1.1 μm Mask | 5 | 5 | 5 | 5 | 5 | 5 | 5 | 5 | 5 | 5 | 5 |
| | Adhesiveness during use of 1.0 μm Mask | 5 | 5 | 4 | 4 | 4 | 4 | 5 | 5 | 5 | 5 | 4 |

C. for 5 minutes. As a result, a 2 μm×2 μm Bayer pattern (near infrared cut filter) was formed.

Next, a Red composition was applied to the Bayer pattern of the near infrared cut filter using a spin coating method such that the thickness of the formed film was 1.0 μm Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the near infrared cut filter. Likewise, a Green composition and a Blue composition were sequentially patterned to form red, green, and blue color patterns.

Next, each of the compositions according to Examples 1 to 12 was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method.

The obtained solid image pickup element was irradiated with light emitted from an infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

The Red composition, the Green composition, the Blue composition, and the composition for forming a near infrared cut filter used in Test Example 2 are as follows.

(Red Composition)

The following components were mixed and stirred, and the obtained mixture was filtered through a nylon filter (manufactured by Pall Corporation) having a pore size of 0.45 μm to prepare a Red composition.

| | |
|---|---|
| Red Pigment Dispersion | 51.7 parts by mass |
| Resin 104 | 0.6 parts by mass |
| Polymerizable compound 104 | 0.6 parts by mass |
| Photopolymerization Initiator 101 | 0.4 parts by mass |
| Surfactant 101 | 4.2 parts by mass |
| Ultraviolet absorber (UV-503, manufactured by Daito Chemical Co., Ltd.) | 0.3 parts by mass |
| PGMEA | 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Resin 104 | 0.3 parts by mass |
| Polymerizable compound 101 | 1.2 parts by mass |
| Photopolymerization Initiator 101 | 0.6 parts by mass |
| Surfactant 101 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Resin 104 | 2.1 parts by mass |
| Polymerizable compound 101 | 1.5 parts by mass |
| Polymerizable compound 104 | 0.7 parts by mass |
| Photopolymerization Initiator 101 | 0.8 parts by mass |
| Surfactant 101 | 4.2 parts by mass |
| Ultraviolet absorber (UV-503, manufactured by Daito Chemical Co., Ltd.) | 0.3 parts by mass |
| PGMEA | 45.8 parts by mass |

(Composition for Forming Near Infrared Cut Filter)

| | |
|---|---|
| Near infrared absorber dispersion | 60 parts by mass |
| Polymerizable compound 101 | 6 parts by mass |
| Resin 101 | 4.45 parts by mass |
| Photopolymerization Initiator 101 | 1.99 parts by mass |
| Surfactant 101 | 4.17 parts by mass |
| Polymerization inhibitor 1 (p-methoxyphenol) | 0.003 parts by mass |
| PGMEA | 23.39 parts by mass |

Raw materials used in the Red composition, the Green composition, the Blue composition, and the composition for forming a near infrared cut filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm³ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm³ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), and 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm³ at a flow rate of 500 g/min. This dispersing treatment was repeated 10 times. As a result, a Blue pigment dispersion was obtained.

Near Infrared Absorber Dispersion 2.5 parts by mass of a near infrared absorber K1, 0.5 parts by mass of a pigment derivative K3, 1.8 parts by mass of a dispersant C2, and 79.3 parts by mass of PGMEA were mixed with each other to obtain a mixed solution, 230 parts by mass of zirconia beads having a diameter of 0.3 mm was further added to the mixed solution, the solution was dispersed using a paint shaker for 5 hours, and the beads were separated by filtration. As a result, a near infrared absorber dispersion was manufactured.

Polymerizable Compound 101: KAYARAD DPHA (Manufactured by Nippon Kayaku Co., Ltd.)

Polymerizable compound 104: a compound having the following structure

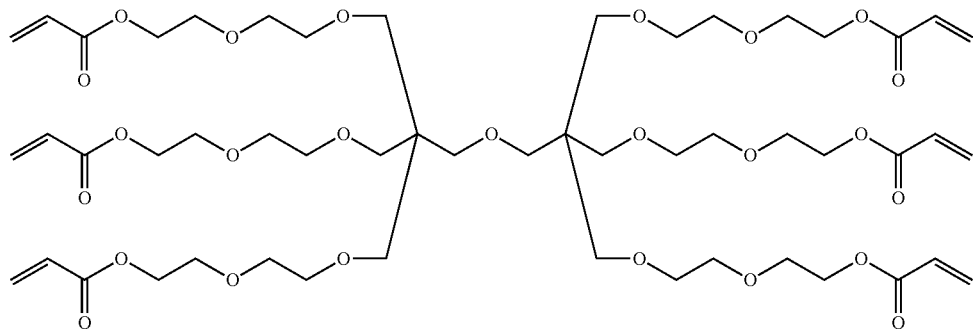 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Resin 101: CYCLOMER P(ACA)230AA (Manufactured by Daicel Corporation)

Resin 104: a resin having the following structure (acid value: 70 mgKOH/g, Mw=11000; a ratio in a structural unit is a molar ratio)

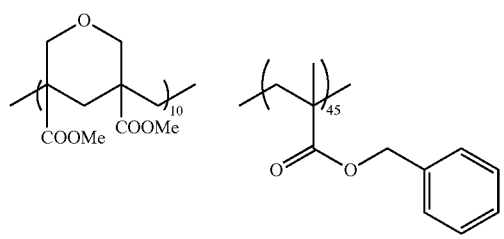

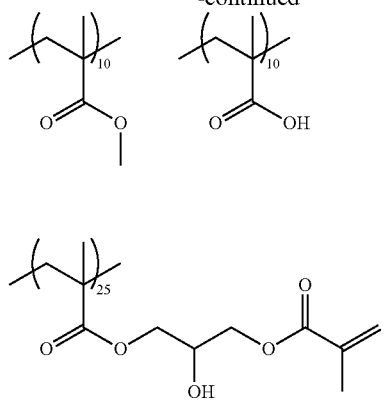

Photopolymerization Initiator 101: IRGACURE-OXE 01 (Manufactured by BASF SE)

Surfactant 101: 1 mass % PGMEA solution of the following mixture (Mw: 14000) In the following formula, "%" representing the proportion of a repeating unit is mol %.

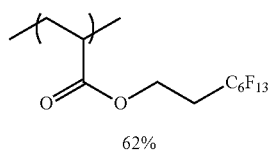

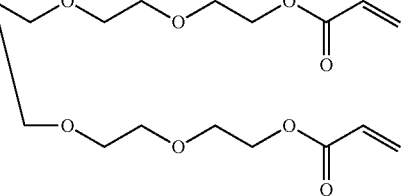

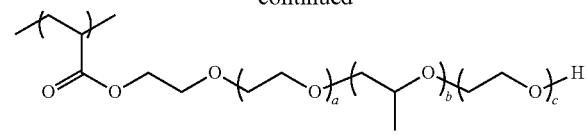

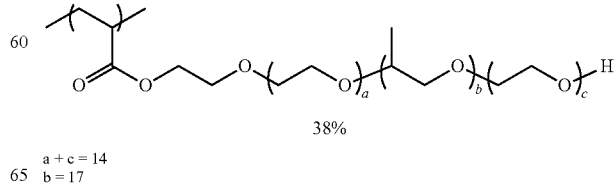

a + c = 14
b = 17

EXPLANATION OF REFERENCES

110: solid image pickup element
111: near infrared cut filter
112: color filter
114: infrared transmitting filter
115: microlens
116: planarizing layer

What is claimed is:

1. A composition comprising:
a coloring material;
a resin;
a polymerizable compound; and
a photopolymerization initiator,
wherein the polymerizable compound includes a compound A having an alkyleneoxy group and three ethylenically unsaturated groups, and
a ratio A/B of a minimum value A of an absorbance of the composition in a wavelength range of 400 to 750 nm to a maximum value B of an absorbance of the composition in a wavelength range of 1100 to 1300 nm is 4.5 or higher.

2. The composition according to claim 1,
wherein the compound A has 2 to 6 alkyleneoxy groups.

3. The composition according to claim 1,
wherein the number of carbon atoms in the alkyleneoxy group is 1 to 3.

4. The composition according to claim 1,
wherein an average number of alkyleneoxy groups in the compound A is 3 to 5.

5. The composition according to claim 1,
wherein the compound A includes a compound having three alkyleneoxy groups and a compound having 4 to 6 alkyleneoxy groups.

6. The composition according to claim 5,
wherein in the compound A, a content of the compound having 4 to 6 alkyleneoxy groups is 20 to 500 parts by mass with respect to 100 parts by mass of the compound having three alkyleneoxy groups.

7. The composition according to claim 1,
wherein the polymerizable compound further includes a compound having four or more ethylenically unsaturated groups.

8. The composition according to claim 1,
wherein a content of the compound A is 50 to 100 mass % with respect to a total mass of the polymerizable compound.

9. The composition according to claim 1,
wherein a molar absorption coefficient of the photopolymerization initiator at a wavelength of 365 nm is 5000 $L \cdot mol^{-1} \cdot cm^{-1}$ or higher.

10. The composition according to claim 1,
wherein the photopolymerization initiator includes an oxime compound.

11. The composition according to claim 1,
wherein the resin includes a resin having a fluorene skeleton.

12. The composition according to claim 1, further comprising:
a near infrared absorber.

13. A film which is formed using the composition according to claim 1.

14. An infrared transmitting filter comprising:
the film according to claim 13.

15. A solid image pickup element comprising:
the film according to claim 13.

16. An image display device comprising:
the film according to claim 13.

17. An infrared sensor comprising:
the film according to claim 13.

* * * * *